United States Patent
Sun et al.

(10) Patent No.: US 11,656,270 B2
(45) Date of Patent: May 23, 2023

(54) APPARATUS AND METHOD OF TESTING ELECTRONIC COMPONENTS

(71) Applicant: ASE TEST, INC., Kaohsiung (TW)

(72) Inventors: Chun-Hung Sun, Kaohsiung (TW); Yi-Ting Liu, Kaohsiung (TW)

(73) Assignee: ASE TEST, INC., Kaohsiung (TW)

( * ) Notice: Subject to any disclaimer, the term of this patent is extended or adjusted under 35 U.S.C. 154(b) by 763 days.

(21) Appl. No.: 16/408,328

(22) Filed: May 9, 2019

(65) Prior Publication Data

US 2020/0355738 A1 Nov. 12, 2020

(51) Int. Cl.
*G01R 31/28* (2006.01)
*G06T 11/20* (2006.01)

(52) U.S. Cl.
CPC ........ *G01R 31/2834* (2013.01); *G06T 11/206* (2013.01)

(58) Field of Classification Search
CPC ............... G01R 31/2834; G01R 31/00; G01R 31/31711; G01R 31/319; G06T 11/206
USPC ........................................................ 702/58
See application file for complete search history.

(56) References Cited

U.S. PATENT DOCUMENTS

| | | | |
|---|---|---|---|
| 2006/0038582 A1* | 2/2006 | Peeters ............ | G01R 31/31701 326/16 |
| 2012/0293195 A1* | 11/2012 | Bourstein ........ | G01R 31/31721 324/750.01 |
| 2020/0284839 A1* | 9/2020 | Diegmann .......... | G01R 31/319 |

OTHER PUBLICATIONS

Patten, Peter, "Divide and Conquer based on Fast Shmoo algorithms", ITC International Test Conference 2004 pp. 197-202.

* cited by examiner

*Primary Examiner* — Michael P Nghiem
(74) *Attorney, Agent, or Firm* — Foley & Lardner LLP

(57) ABSTRACT

An apparatus is provided that includes a control unit and a memory including computer program code. The apparatus is capable of applying a first signal having a first value and a second signal having a second value to an electronic component and receiving a first feedback signal. The apparatus is capable of determining a first parameter associated with the first feedback signal. The apparatus is capable of applying a third signal having a third value and the second signal to the electronic component and receiving a second feedback signal. The apparatus is capable of determining a second parameter associated with the second feedback signal. The apparatus is capable of applying a fourth signal having a fourth value and the second signal to the electronic component if the first parameter is different from the second parameter.

1 Claim, 21 Drawing Sheets

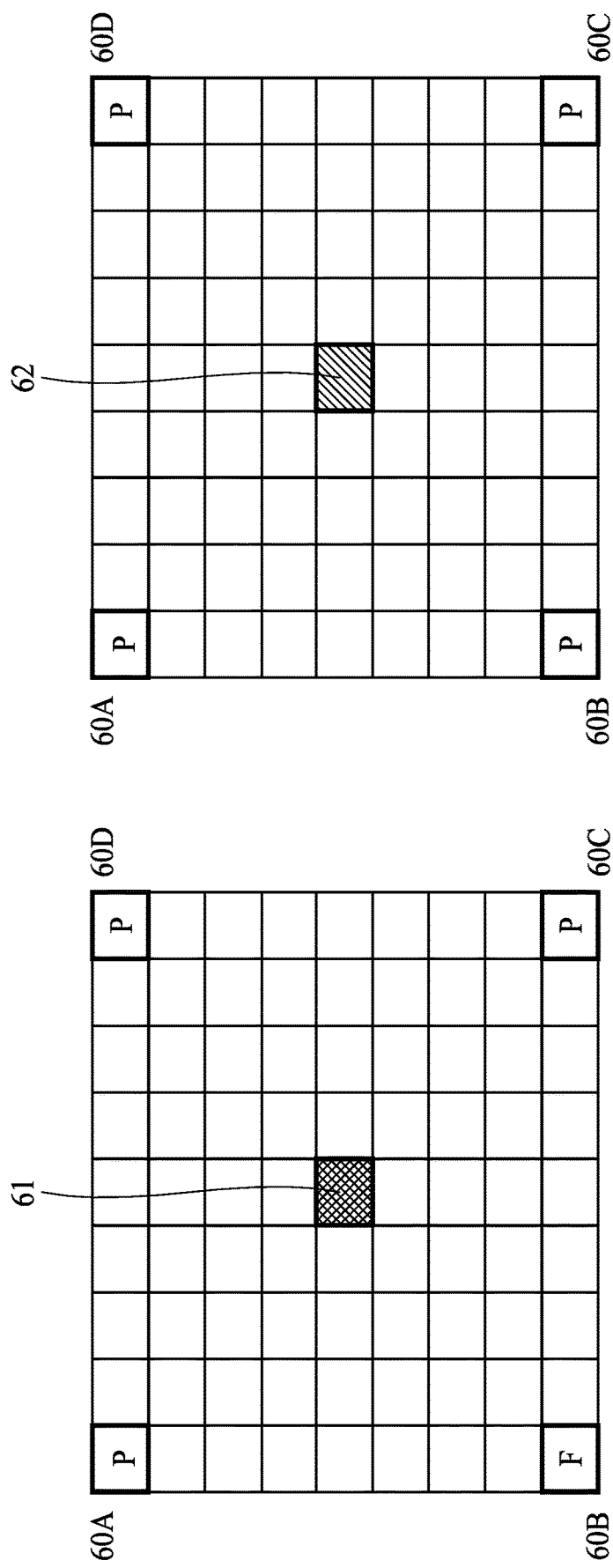

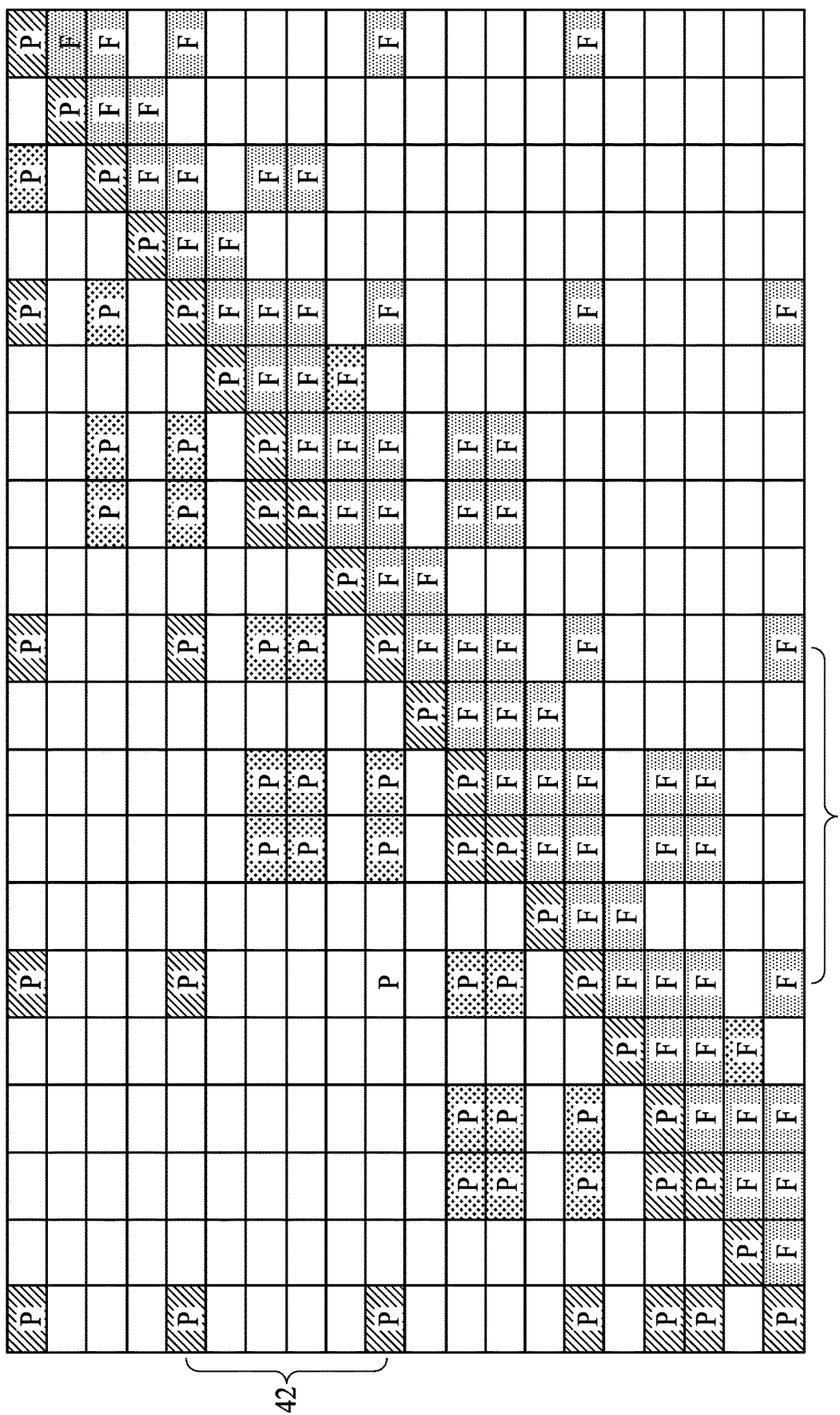

APPARATUS AND METHOD OF TESTING ELECTRONIC COMPONENTS

BACKGROUND

1. Technical Field

The present disclosure relates generally to an apparatus of testing electronic components and a method of testing electronic components.

2. Description of the Related Art

After an integrated device/electronic component is manufactured, analysis or tests can be conducted to verify the functions of the integrated device/electronic component. A failure analysis is to determine the operation regions of an integrated device/electronic component under parameter variations (for example, voltages, currents and timings). For example, a failure analysis can be used to determine the limits that an integrated device/electronic component can bear under various input signals.

Shmoo test is one of the tests that may be used in the failure analysis or the automatic test equipment (ATE) for integrated devices. Shmoo test involves providing a visual representation of a series of measurements results of an integrated device in a form of two dimensional plots/diagrams (e.g., Shmoo-plot). In the Shmoo test, each individual measurement performed on the ATE can result in a pass-fail or in a numerical result (for example, failure counts or bit error rate). In a comparative approach, a Shmoo plot is produced over wide parameter ranges with high-resolutions and thus a high number of measurements involved. As those measurements are performed sequentially, the generation of a Shmoo plot is time-consuming.

SUMMARY

A method and an apparatus for improving the speed of the testing of integrated devices is proposed. In the proposed method and apparatus, less measurements are involved for completing a Shmoo plot and thus the overall time of the testing of integrated devices/electronic components can be reduced. In the proposed method and apparatus, the computation complexity is also reduced and thus the system overload can be reduced as well.

In one or more embodiments, an apparatus including a control unit and a memory including computer program code is provided. The memory and the computer program code are configured to, with the control unit, cause the apparatus to perform operations. The apparatus is capable of applying a first signal having a first value and a second signal having a second value to an electronic component and receiving a first feedback signal. The apparatus is capable of determining a first parameter associated with the first feedback signal. The apparatus is capable of applying a third signal having a third value and the second signal to the electronic component and receiving a second feedback signal. The apparatus is capable of determining a second parameter associated with the second feedback signal. The apparatus is capable of applying a fourth signal having a fourth value and the second signal to the electronic component if the first parameter is different from the second parameter. Wherein a first difference exists between the third value and the first value and wherein a second difference exists between the fourth value and the first value.

In one or more embodiments, an apparatus including a control unit and a memory including computer program code is provided. The memory and the computer program code are configured to, with the control unit, cause the apparatus to perform operations. The apparatus is capable of receiving a first parameter associated with a first value of a first coordinate and a second value of a second coordinate. The apparatus is capable of receiving a second parameter associated with a third value of the first coordinate and the second value of a second coordinate. The apparatus is capable of receiving a third parameter associated with a fourth value of the first coordinate and the second value of the second coordinate if the first parameter is different from the second parameter. Wherein a first difference exists between the third value and the first value and wherein a second difference exists between the fourth value and the first value.

In one or more embodiments, a method for testing electronic components is provided. The method includes receiving a first parameter associated with a first value of a first coordinate and a second value of a second coordinate. The method includes receiving a second parameter associated with a third value of the first coordinate and the second value of a second coordinate. The method includes receiving a third parameter associated with a fourth value of the first coordinate and the second value of the second coordinate if the first parameter is different from the second parameter. Wherein a first difference exists between the third value and the first value and wherein a second difference exists between the fourth value and the first value.

BRIEF DESCRIPTION OF THE DRAWINGS

Aspects of the present disclosure are readily understood from the following detailed description when read with the accompanying drawings. It is noted that various features may not be drawn to scale, and the dimensions of the various features may be arbitrarily increased or reduced for clarity of discussion.

FIG. 9A, FIG. 9B and FIG. 9C are various operations for testing electronic components in accordance with some comparative embodiments of the present disclosure.

FIG. 10A and FIG. 10B are schematic diagrams showing a visual representation of the measurement results after the testing is completed, in accordance with some comparative embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
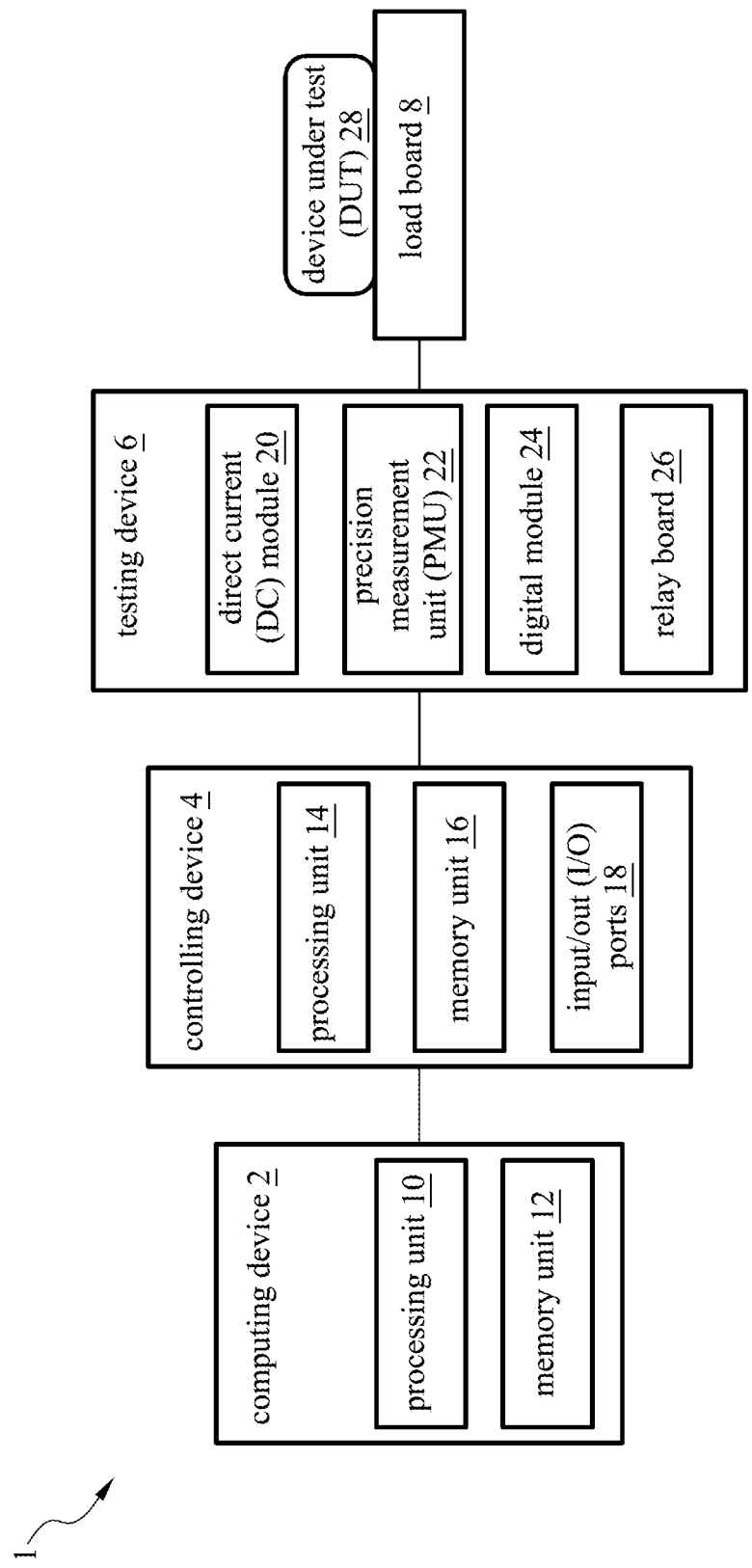
FIG. 1 illustrates a schematic view of an apparatus for testing electronic components in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a schematic view of an apparatus for testing electronic components in accordance with some embodiments of the present disclosure. The apparatus 1 can be used in the failure analysis of an integrated device/electronic component. The apparatus 1 can be used in the automatic test of an integrated device/electronic component.

The apparatus 1 includes a computing device 2, a controlling device 4, a testing device 6 and a load board 8. One or more electronic connections exist between the computing device 2 and the controlling device 4. One or more electronic connections exist between the controlling device 4 and the testing device 6. One or more electronic connections exist between the testing device 6 and the load board 8.

The computing device 2 includes a processing unit 10 and a memory unit 12.

The processing unit 10 may include but is not limited to, for example, a central processing unit (CPU), a microprocessor, an application-specific instruction set processor (ASIP), a machine control unit (MCU), a graphics processing unit (GPU), a physics processing unit (PPU), a digital signal processor (DSP), an image processor, a coprocessor, a storage controller, a floating-point unit, a network processor, a multi-core processor, a front-end processor or the like. The processing unit 10 can be electrically connected to the memory unit 12.

The memory unit 12 may include but is not limited to a random-access memory (RAM) such as a static RAM (SRAM) or a dynamic RAM (DRAM). In some embodiments, the memory unit 12 may include a read-only memory (ROM). The memory unit 12 may include a cache (not shown) for storing data that have recently been accessed, so that future requests for that data can be served faster. The data stored in the cache may include the result of an earlier computation of the processing unit 10. The data stored in the cache may include a copy of data stored in the memory unit 12.

The computing device 2 includes Application Programming Interface (API) installed thereon for generating data used for testing. The data generated by the API can be stored in the memory unit 12.

The controlling device 4 includes a processing unit 14, a memory unit 16 and one or more input/out (I/O) ports 18.

The processing unit 14 may include but is not limited to, for example, a central processing unit (CPU), a microprocessor, an application-specific instruction set processor (ASIP), a machine control unit (MCU), a graphics processing unit (GPU), a physics processing unit (PPU), a digital signal processor (DSP), an image processor, a coprocessor, a storage controller, a floating-point unit, a network processor, a multi-core processor, a front-end processor or the like. The processing unit 14 can be electrically connected to the memory unit 16. The processing unit 14 can be electrically connected to the I/O ports 18. The memory unit 16 can be electrically connected to the I/O ports 18.

The memory unit 16 may include but is not limited to a random-access memory (RAM) such as a static RAM (SRAM) or a dynamic RAM (DRAM). In some embodiments, the memory unit 16 may include a read-only memory (ROM). The memory unit 16 may include a cache (not shown) for storing data that have recently been accessed, so that future requests for that data can be served faster. The data stored in the cache may include the result of an earlier computation of the processing unit 14. The data stored in the cache may include a copy of data stored in the memory unit 16.

The controlling device 4 may receive testing data from the computing device 2. The controlling device 4 may generate testing instructions/commands based on the testing data received from the computing device 2. The testing instructions/commands generated by the controlling device 4 can be stored in the memory unit 16. The testing instructions/commands generated by the controlling device 4 can be transmitted to the testing device 6 through the I/O ports 18.

The I/O ports 18 can be any computer ports that are capable of sending and receiving data. The I/O port 18 may include but is not limited to a Universal Serial Bus (USB) port, a IEEE 1394 port (also known as FireWire port), a PS/2 port (also referred to as Mini-DIN ports), a serial port (also known as RS-232 or communication (COM) port), a parallel port (also known as the Line Printer (LPT) port), a Small Computer Systems Interface (SCSI) port, a ⅛-inch audio mini-jack, a RG-6 coaxial ports, or a Musical Instrument Digital Interface (MIDI) ports.

The testing device 6 includes one or more modules for testing integrated device/electronic components. Referring to FIG. 1, the testing device 6 includes a direct current (DC) module 20, a precision measurement unit (PMU) 22, a digital module 24 and a relay board 26. The controlling device 4 may transmit testing instructions/commands to corresponding modules of the testing device 6 based on the types/contents of the testing instructions/commands.

The DC module 20 can be used for testing DC parameters of an integrated device/electronic component. In some embodiments, the DC module 20 may provide DC currents to the integrated device/electronic component under test. In some embodiments, the DC module 20 may provide voltages to the integrated device/electronic component under test.

The PMU 22 can be used for testing DC parameters of an integrated device/electronic component. The PMU 22 may provide DC parameters that have high accuracy. The PMU 22 may provide DC parameters that have a small amplitude/magnitude. In some embodiments, the PMU 22 may provide an accurate DC current that has a small value. In some embodiments, the PMU 22 may provide an accurate voltage that has a small magnitude.

The digital module 24 can be used for testing functions of an integrated device/electronic component. In some embodiments, the digital module 24 can be used to provide various signals to the DUT 28. In some embodiments, the digital module 24 can be used in testing the Inter-Integrated Circuit (I2C) bus of the DUT 28. In some embodiments, the digital module 24 can be used in testing the Transistor-Transistor Logic (TTL) of the DUT 28. In some embodiments, the digital module 24 can be used in testing the Serial Peripheral Interface (SPI) of the DUT 28. In some embodiments, the digital module 24 can be used in providing baseband signals or radio frequency signals to the DUT 28.

In some embodiments, the digital module 24 can provide signals having different switching frequencies to the DUT 28. In some embodiments, the digital module 24 can control the rising/falling edges of the signals to be provided to the DUT 28. In some embodiments, the digital module 24 can provide synchronous or non-synchronous signals to the DUT 28.

The relay board 26 can provide path routings to the testing device 6. In some embodiments, if the number of the pins of the DUT 28 exceeds the number of testing channels that can be provided by the testing device 6, some of the pins may be connected to the same channel through the relay board 26. The relay board 26 can be used to connect different pins to a specific testing channel of the testing device 6.

A device under test (DUT) 28 can be mounted on the load board 8. One or more conductive connections or physical connections exist between the DUT 28 and the load board 8. In some embodiments, the DUT 28 can be an integrated circuit or an electronic component.

Figure 2A:
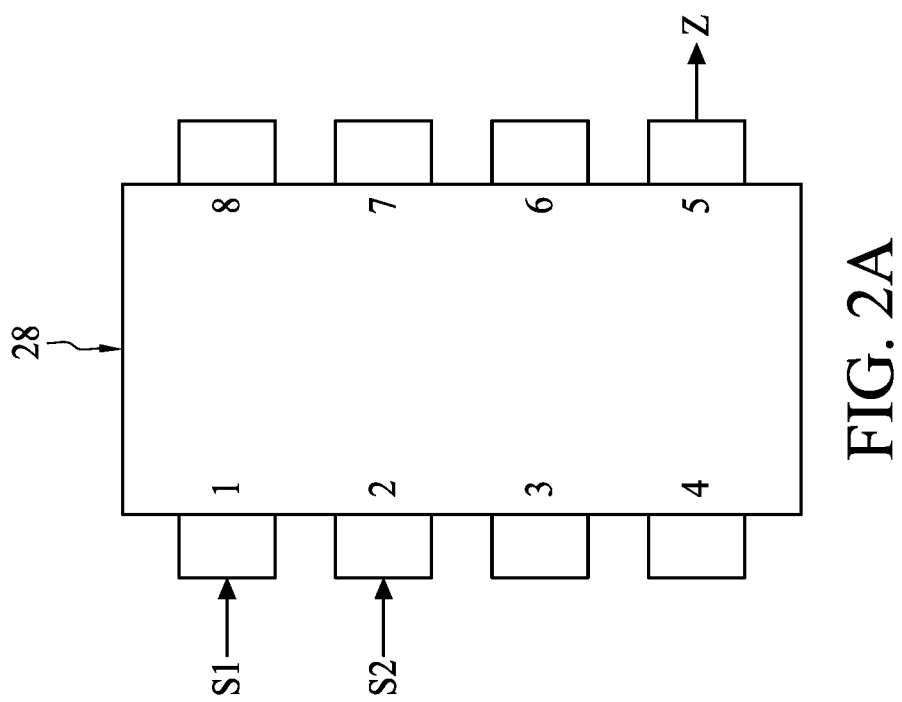
FIG. 2A illustrates a perspective view of a device under test (DUT) in accordance with some embodiments of the present disclosure.

FIG. 2A illustrates a perspective view of a device under test (DUT) in accordance with some embodiments of the present disclosure. Referring to FIG. 2A, the DUT 28 includes eight pins. It can be contemplated that the DUT 28 may include more pins or less pins. During the failure analysis or the automatic test, one or more test signals/commands may be provided to the DUT 28. In some embodiments, a signal S1 is provided to the DUT 28 and a signal S2 is provided to the DUT 28. The DUT 28 generates an output signal (or feedback signal) Z in response to the signal S1 and the signal S2.

The relations between the signal S1, the signal S2 and the feedback signal Z1 can be expressed in the equation below:

$$Z=f(S1,S2) \quad (1)$$

The feedback signal Z can be a function of the signal S1 and the signal S2.

In some embodiments, the equation (1) may be represented as follows:

$$Z=\text{sgn}(S1-S2) \quad (2)$$

In some embodiments, the equation (1) may be represented as follows:

$$Z=(S1-S2)\times R2/R1 \quad (3)$$

In equation (3), R1 and R2 are values of resistors in DUT 28, wherein R2/R1 is a constant value.

In some embodiments, the signal S1 and the signal S2 can be provided to different pins of the DUT 28. In some embodiments, the signal S1 and the signal S2 can be provided to the same pin of the DUT 28. Referring to FIG. 2A, the signal S1 can be provided to the pin "1" of the DUT 28 and the signal S2 can be provided to the pin "2" of the DUT 28. It can be contemplated that the signals S1 and S2 can be provided to other pins of the DUT 28. Referring to FIG. 2A, the feedback signal Z can be generated by the DUT 28 at the pin "5." It can be contemplated that the feedback signal Z can be generated by the DUT 28 at other pins.

In some embodiments, the signal S1 and the signal S2 can be provided to the DUT 28 simultaneously. In some embodiments, the signal S1 and the signal S2 can be provided to the DUT 28 at the same time. In some embodiments, the signal S1 and the signal S2 can be provided to the DUT 28 sequentially. In some embodiments, the signal S1 and the signal S2 can be provided to the DUT 28 at different timings.

In some embodiments, the signal S1 and the signal S2 can include the same attribute (for example, both signals S1 and S2 are voltages or currents). In some embodiments, the signal S1 and the signal S2 can include different attributes.

Figure 2B:
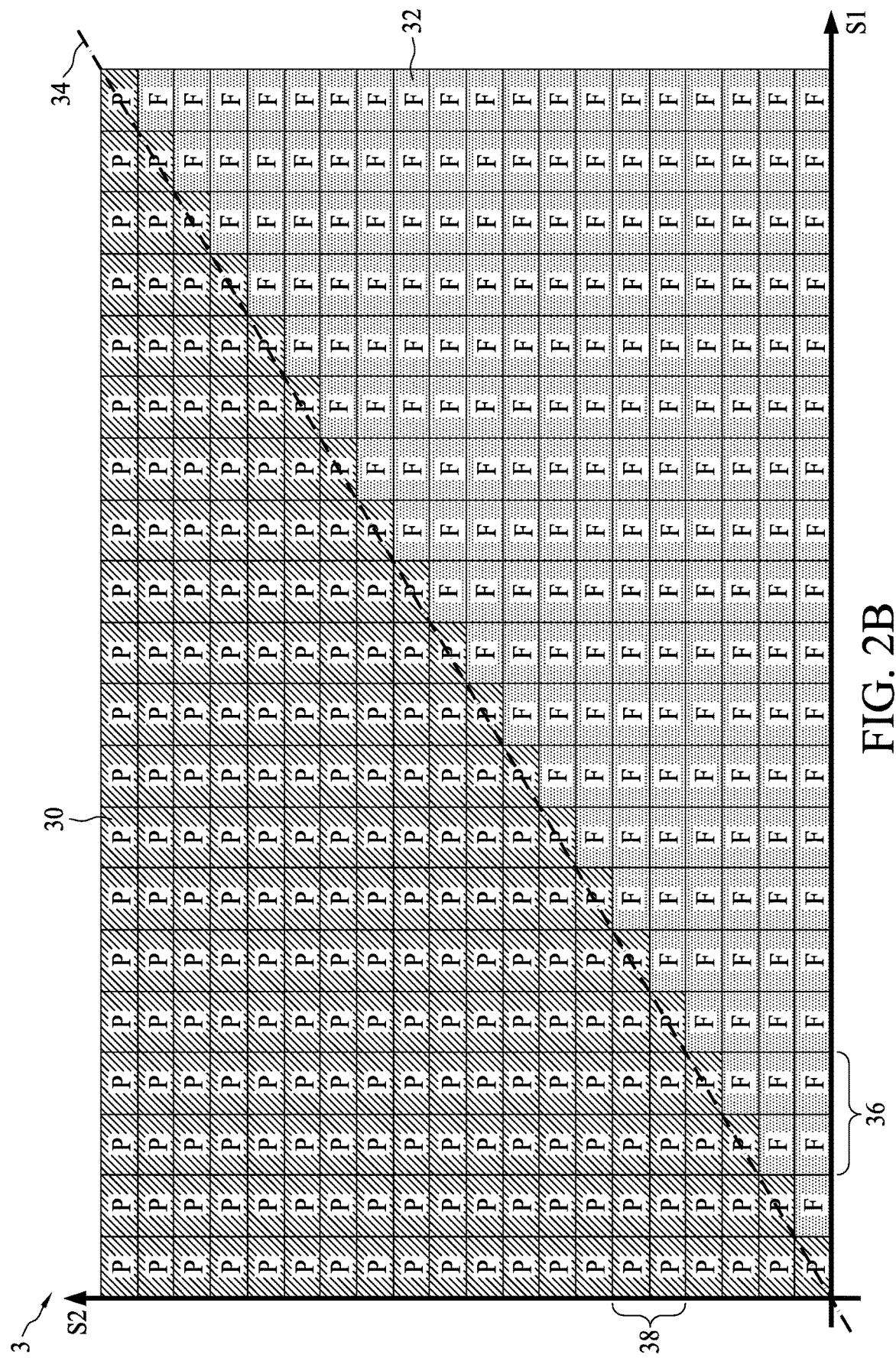
FIG. 2B illustrates a visual representation of a series of measurements results of a DUT in accordance with some embodiments of the present disclosure.

FIG. 2B illustrates a visual representation of a series of measurements results of a DUT in accordance with some embodiments of the present disclosure. Referring to FIG. 2B, the visual representation 3 includes a series of measurements results of the DUT 28 shown in a form of two dimensional plots/diagrams. This kind of visual representation 3 is sometimes referred to as a "Shmoo" plot. Referring to FIG. 2B, the visual representation 3 is provided over a horizontal coordinate and a vertical coordinate. The horizontal coordinate represents the signal S1 provided to the DUT 28 and the vertical coordinate represents the signal S2 provided to the DUT 28.

Referring to FIG. 2B, a measurement result 30 is obtained by providing the signal S1 having a value 30_*s*1 and the signal S2 having a value 30_*s*2 to the DUT 28. A measurement result 32 is obtained by providing the signal S1 having a value 32_*s*1 and the signal S2 having a value 32_*s*2 to the DUT 28. The measure result 30 in FIG. 2B labeled as "P" means that the feedback signal Z provided by the DUT 28 in response to the signal S1 having the value 30_*s*1 and the signal S2 having the value 30_*s*2 complies with or fulfills a specific criterion for the DUT 28. The measure result 32 in FIG. 2B labeled as "F" means that the feedback signal Z provided by the DUT 28 in response to the signal S1 having the value 32_*s*1 and the signal S2 having the value 32_*s*2 fails to comply with or fails to fulfill a specific criterion for the DUT 28.

The visual representation 3 is produced over parameter ranges having resolutions. Referring to FIG. 2B, the visual representation 3 is produced by providing the signal S1 having a resolution 36 and the signal S2 having a resolution 38 to the DUT 28. In some embodiments, the resolution 36 can be a voltage amplitude difference. In some embodiments, the resolution 36 can be a current value difference. In some embodiments, the resolution 38 can be a voltage amplitude difference. In some embodiments, the resolution 38 can be a current value difference. In some embodiments, the resolution 36 can be identical to the resolution 38. In some embodiments, the resolution 36 can be different from the resolution 38.

In some embodiments, the resolution 36 can be a voltage difference of 0.0125 Volts. In some embodiments, the resolution 38 can be a voltage difference of 0.0125 Volts. In some embodiments, the resolution 36 can be a current difference of 0.0125 A. In some embodiments, the resolution 38 can be a current difference of 0.0125 A. It can be contemplated that the resolutions 36 and 38 can be parameters other than voltage and current. It can be contemplated that the resolutions 36 and 38 can be parameters having other value differences.

Referring to FIG. 2B, a virtual edge 34 exists between the region where all the measurement results are "P" and the region where all the measurements are "F." The operation regions of an integrated device/electronic component under parameter variations (for example, voltages, currents and timings) can be determined after the virtual edge 34 is obtained.

In the embodiment shown in FIG. 2B, 20 different values of the signal S1 are provided to the DUT 28 during the test and 20 different values of the signal S2 are provided to the DUT 28 during the test. Combinations of these different values of the signals S1 and S2 results in 400 measurement results of the DUT 28. Therefore, the virtual edge 34 can be obtained after the 400 measurements are completed.

Assuming that each measurements on the DUT 28 takes 1 second, nearly 7 minutes will take to complete a Shmoo plot for a single DUT 28. This is sometimes unacceptable because an engineer may have to conduct a failure analysis for dozens or even hundreds of electronic components or integrated devices. Additionally, as the resolutions of the signals S1 and S2 increase, over thousands of measurement results may sometimes be performed to complete a Shmoo plot for a single electronic component (for example, 6561 measurements are to be conducted for a single electronic component in the embodiments shown in 6A, 7A and 8A). The overall time taken to complete the test would be tremendous.

FIGS. 3A, 3B, 3C and 3D are various operations for testing electronic components in accordance with some embodiments of the present disclosure.

Figure 3A:
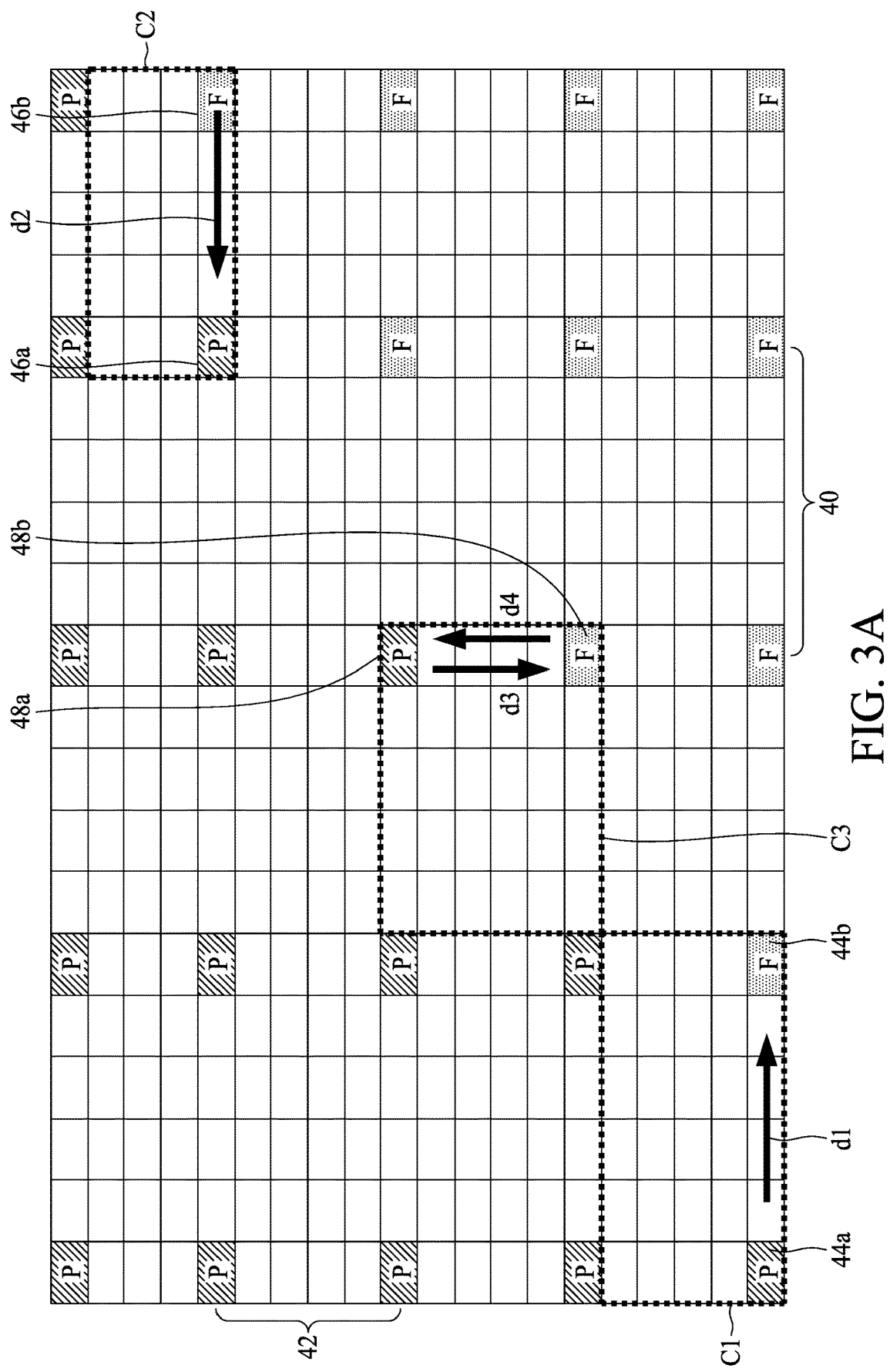
FIG. 3A, FIG. 3B, FIG. 3C and FIG. 3D are various operations for testing electronic components in accordance with some embodiments of the present disclosure.

Referring to FIG. 3A, a method for testing electronic components includes providing the signal S1 having different values and the signal S2 having different values to the DUT 28. Referring to FIG. 3A, the signal S1 is provided to the DUT 28 incrementally with a value difference 40. The signal S2 is provided to the DUT 28 incrementally with a value difference 42. The value difference 40 can be selected to be greater than the resolution 36 so as to reduce the total number of measurements performed. The value difference 42 can be selected to be greater than the resolution 38 so as to reduce the total number of measurements performed.

In some embodiments, the difference value 40 can be selected to be identical to the difference value 42. In some embodiments, the difference value 40 can be selected to be different from the difference value 42.

The method includes recording the status of each feedback signal Z in response to different combinations of the signal S1 and the signal S2. Referring to FIG. 3A, five different values of the signal S1 and five different values of the signal S2 are provided to the DUT 28. The five different values of the signal S1 and the five different signals of the signal S2 result in 25 combinations and thus 25 measurement results (e.g., 25 feedback signals Z) are obtained. In some embodiments, these 25 measurements conducted are referred to as "pilot measurements" or "pilot points."

Each of the feedback signals Z will be compared with a specification or a criterion of the DUT 28 for determining their status. The method includes visualizing the status of each feedback signal Z in response to different combinations of the signal S1 and the signal S2. Referring to FIG. 3A, these feedback signals are labeled with "P" or "F" depending on whether they fulfill such specification or criterion of the DUT 28. It can be roughly tell from FIG. 3A that there is a border between a region wherein all the statuses are labeled with "P" and a region wherein all the statuses are labeled with "F." More measurements can be conducted so as to obtain a more precise operation region of the DUT 28.

In the method in accordance with some embodiments of the present disclosure, further measurements can be conducted commencing from a pair of statuses that include both "P" and "F." Referring to FIG. 3A, further measurements can be conducted commencing from a pair including the status 44a and the status 44b. In some embodiments, further measurements can be conducted commencing from a pair including the status 46a and the status 46b. In some embodiments, further measurements can be conducted commencing from a pair including the status 48a and the status 48b. In some embodiments, further measurements can be conducted between any pair of statuses that include both "P" and "F.".

In the subsequent paragraphs, the measurement results obtained commencing from the pair including the status 44a and the status 44b can be referred to as a "constellation." The measurement results obtained commencing from the pair including the status 46a and the status 46b can be referred to as another "constellation." The measurement results obtained commencing from the pair including the status 48a and the status 48b can be referred to as yet another "constellation."

Referring to FIG. 3A, the measurement results obtained commencing from the pair including the status 44a and the status 44b can be referred to as constellation C1. The measurement results obtained commencing from the pair including the status 46a and the status 46b can be referred to as constellation C2. The measurement results obtained commencing from the pair including the status 48a and the status 48b can be referred to as constellation C3.

Take the pair including the status 44a and the status 44b (e.g., constellation C1) as an example, further measurements between the status 44a and the status 44b can be performed in a direction d1. Further measurements can be conducted on the DUT 28 by gradually increasing the value of the signal S1 while keeping the value of the signal S2 unchanged. In some embodiments, each time the value of the signal S1 can be increased by the resolution 36.

Take the pair including the status 46a and the status 46b (e.g., constellation C2) as an example, further measurements between the status 46a and the status 46b can performed in a direction d2. Further measurements can be conducted on the DUT 28 by gradually decreasing the value of the signal S1 while keeping the value of the signal S2 unchanged. In some embodiments, each time the value of the signal S1 can be decreased by the resolution 36.

Take the pair including the status 48a and the status 48b (e.g., constellation C3) as an example, further measurements between the status 48a and the status 48b can be performed in a direction d3. Further measurements can be conducted on the DUT 28 by gradually increasing the value of the signal S2 while keeping the value of the signal S1 unchanged. In some embodiments, each time the value of the signal S2 can be increased by the resolution 38.

Take the pair including the status 48a and the status 48b (e.g., constellation C3) as an example, further measurements between the status 48a and the status 48b can be performed in a direction d4. Further measurements can be conducted on the DUT 28 by gradually decreasing the value of the signal S2 while keeping the value of the signal S1 unchanged. In some embodiments, each time the value of the signal S2 can be decreased by the resolution 38.

Figure 3B:
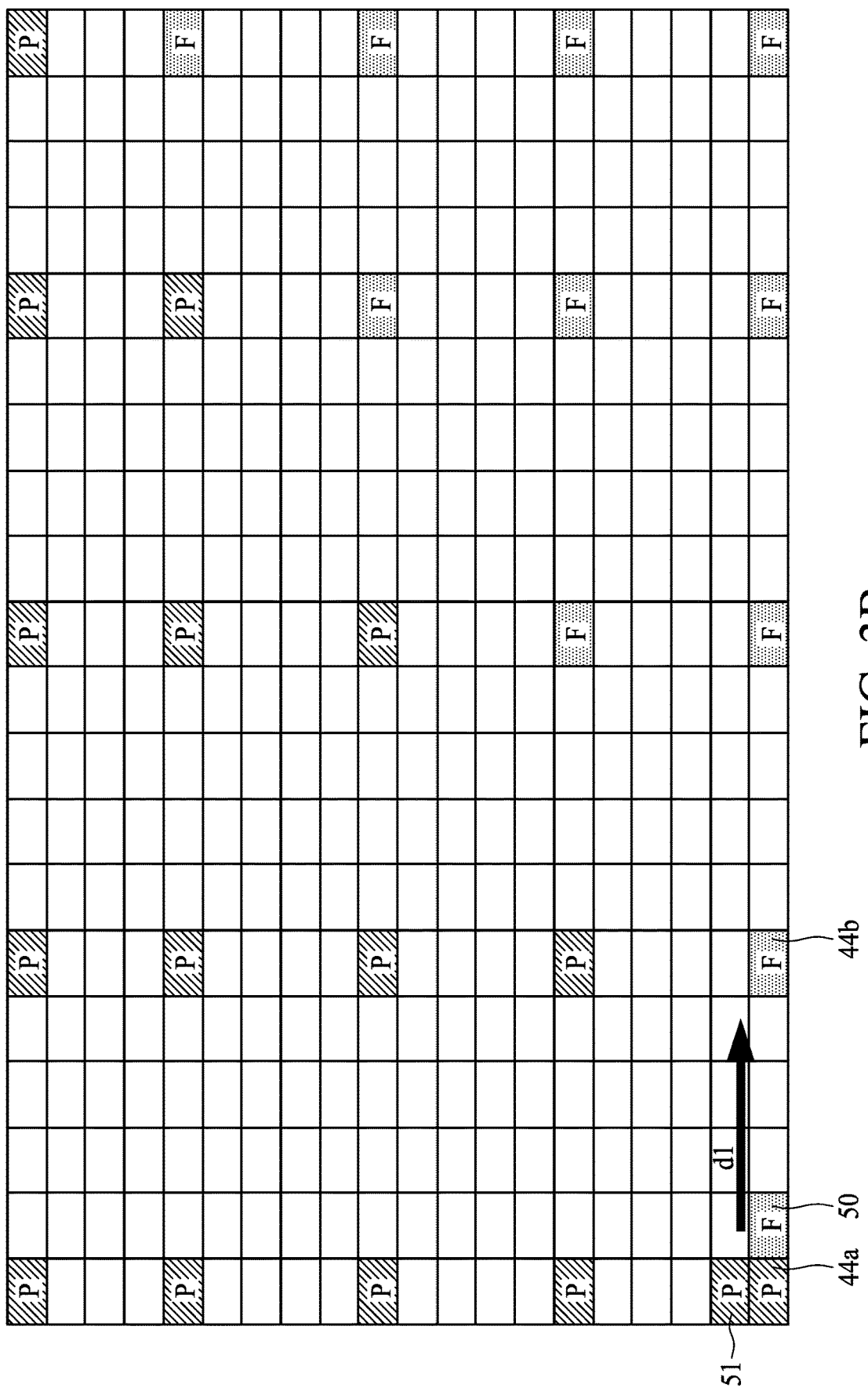

Referring to FIG. 3B, operations conducted between the status 44a and the status 44b in the direction d1 is described and explained. In the method in accordance with some embodiments of the present disclosure, once a status different from the status 44a is found along the direction d1, the increment of the value of the signal S1 is halted and the value of the signal S2 is increased. In addition, the value of the signal S1 is reduced to the last value when the status has not been changed.

Assuming that the status 44a is obtained by providing the signal S1 having a value 44a_s1 and providing the signal S2 having a value 44a_s2 to the DUT 28, and that the status 50 is obtained by providing the signal S1 having a value 50_s1 and providing the signal S2 having a value 50_s2 to the DUT 28. The value 50_s1 is greater than the value 44a_s1 and the value 50_s2 is identical to the value 44a s2.

Once the status 50 is determined to be different from the status 44a, the method includes an operation for obtaining the status 51. In order to obtain the status 51, the signal S1 having a value 51_s1 and the signal S2 having a value 51_s2 is provided to the DUT 28. The value 51_s1 is identical to the value 44a_s1 and the value 51_s2 is greater than the value 44a_s2.

Figure 3C:
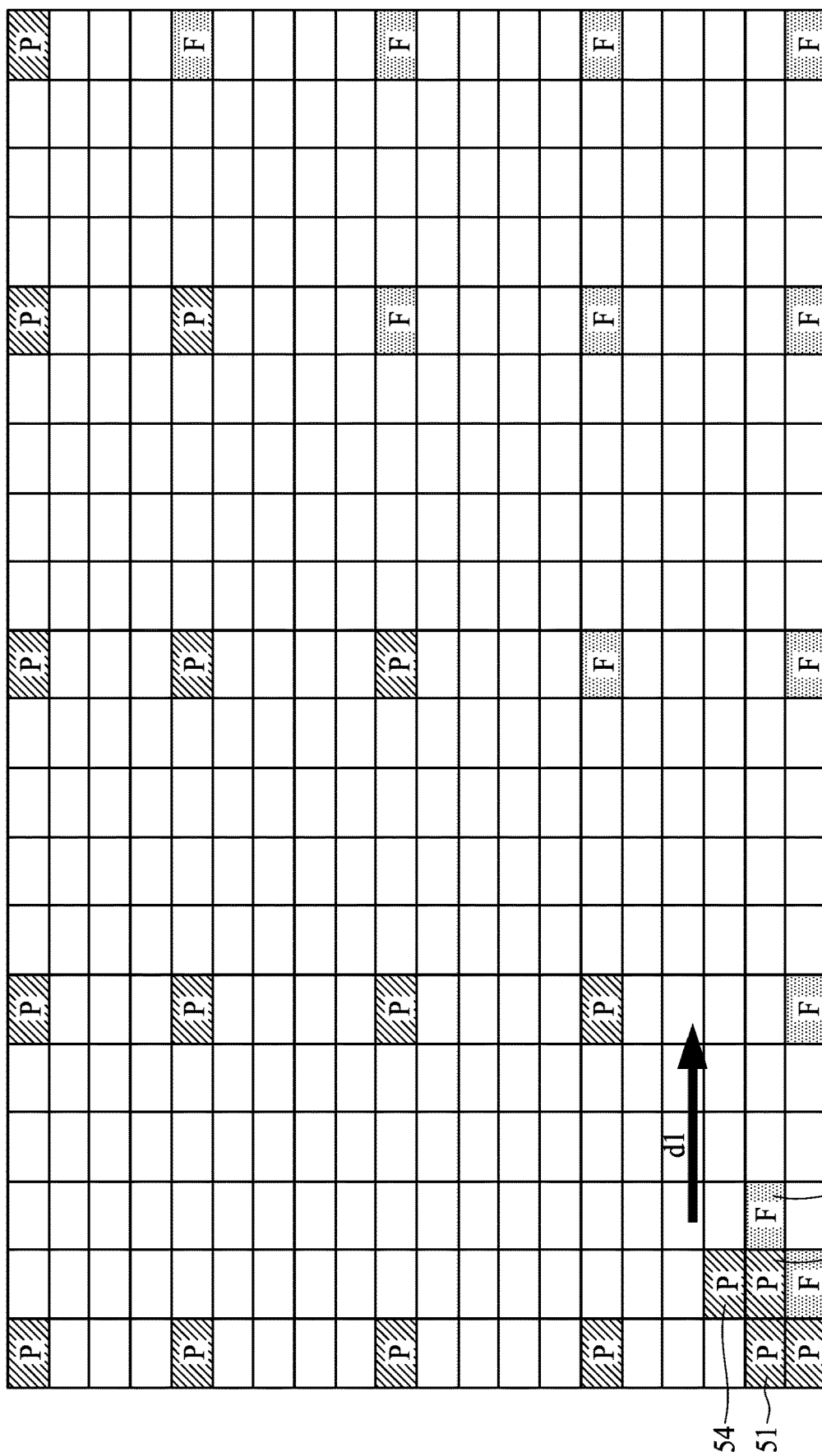

Referring to FIG. 3C, further operations conducted between the status 44a and the status 44b in the direction d1 is described and explained. After the status 51 is obtained, further operations can be conducted to obtain a status change (e.g., a change from "P" to "F" or vice versa) of the DUT 28 along the direction d1. In the example shown in FIG. 3C, a status change can be found between the status 52 and the status 53.

The method includes increasing the value of the signal S1 until a status change is found. For example, once the status 52 is determined to be identical to that of the status 51, the method includes an operation for obtaining the status 53. In order to obtain the status 53, the signal S1 having a value 53_s1 and the signal S2 having a value 53_s2 is provided to the DUT 28. The value 53_s1 is greater than the value 52_s1 and the value 53_s2 is identical to the value 52_s2.

Once a status change is found along the direction d1, the increment of the value of the signal S1 is halted and the value of the signal S2 is increased. In addition, the value of the signal S1 is reduced to the last value when the status has not been changed. For example, once the status 53 is determined to be different from the status 52, the method includes an operation for obtaining the status 54. In order to obtain the status 54, the signal S1 having a value 54_s1 and the signal S2 having a value 54_s2 is provided to the DUT 28. The value 54_s1 is identical to the value 52_s1 and the value 54_s2 is greater than the value 52_s2.

The operations as described in accordance with FIGS. 3B and 3C will continue until a virtual edge/border is found within a constellation.

Figure 3D:
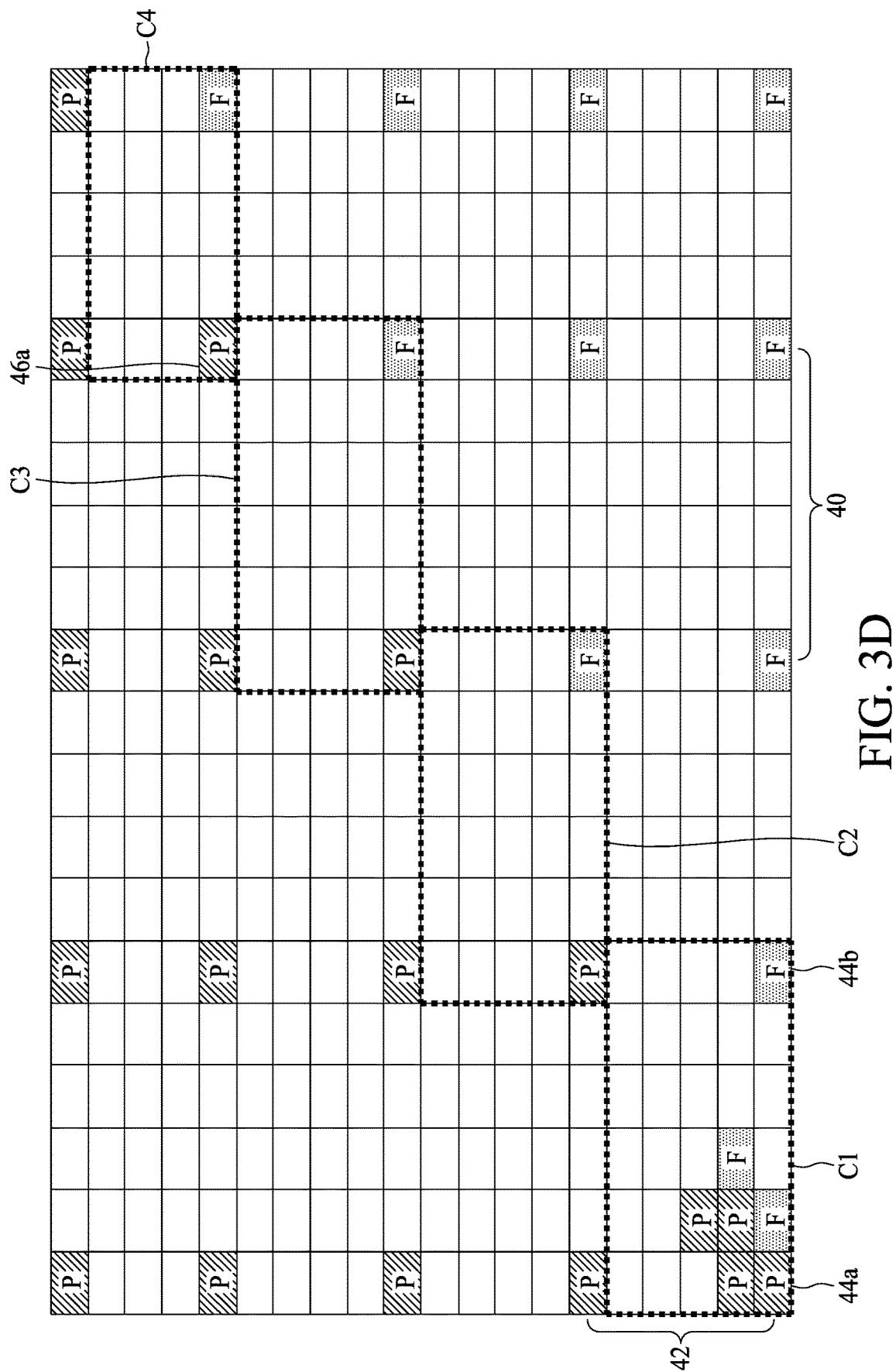

Referring to FIG. 3D, the operations as described in accordance with FIGS. 3B and 3C may continue until a virtual edge/border is found within the constellation C1. After a virtual edge/border is found within the constellation C1, the operations as described in accordance with FIGS. 3B and 3C can be conducted in another constellation. In some embodiments, the operations as described in accordance with FIGS. 3B and 3C can be conducted on the constellation C2, after a virtual edge/border is found within the constellation C1. In some embodiments, the operations as described in accordance with FIGS. 3B and 3C can be conducted on the constellation C3, after a virtual edge/border is found within the constellation C1. In some embodiments, the operations as described in accordance with FIGS. 3B and 3C can be conducted on the constellation C4, after a virtual edge/border is found within the constellation C1.

In some embodiments, the operations as described in accordance with FIGS. 3B and 3C may continue until the signal S2 reaches a predetermined value T1 (e.g., a threshold T1). Take the constellation C1 as an example, the threshold T1 can be a value equal to the sum of 44a_s2 and the difference value 42. Take the constellation C4 as an example, the threshold T1 can be a value equal to the sum of 46a_s2 (e.g., the value of the signal S2 that provided to the DUT 28 to obtain the status 46a) and the difference value 42.

Figure 4A:
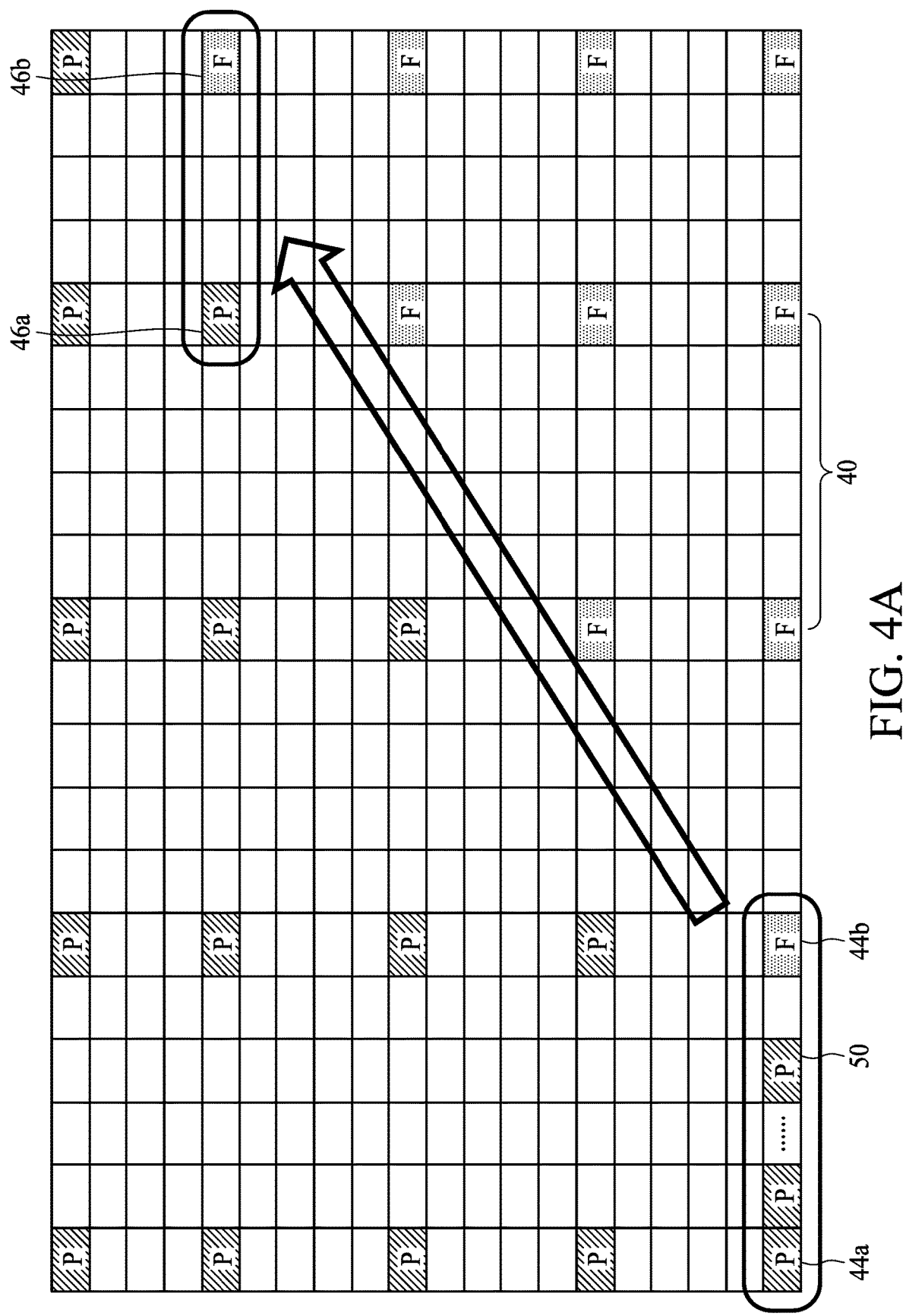
FIG. 4A, FIG. 4B and FIG. 4C are various operations for testing electronic components in accordance with some embodiments of the present disclosure.
Figure 4B:
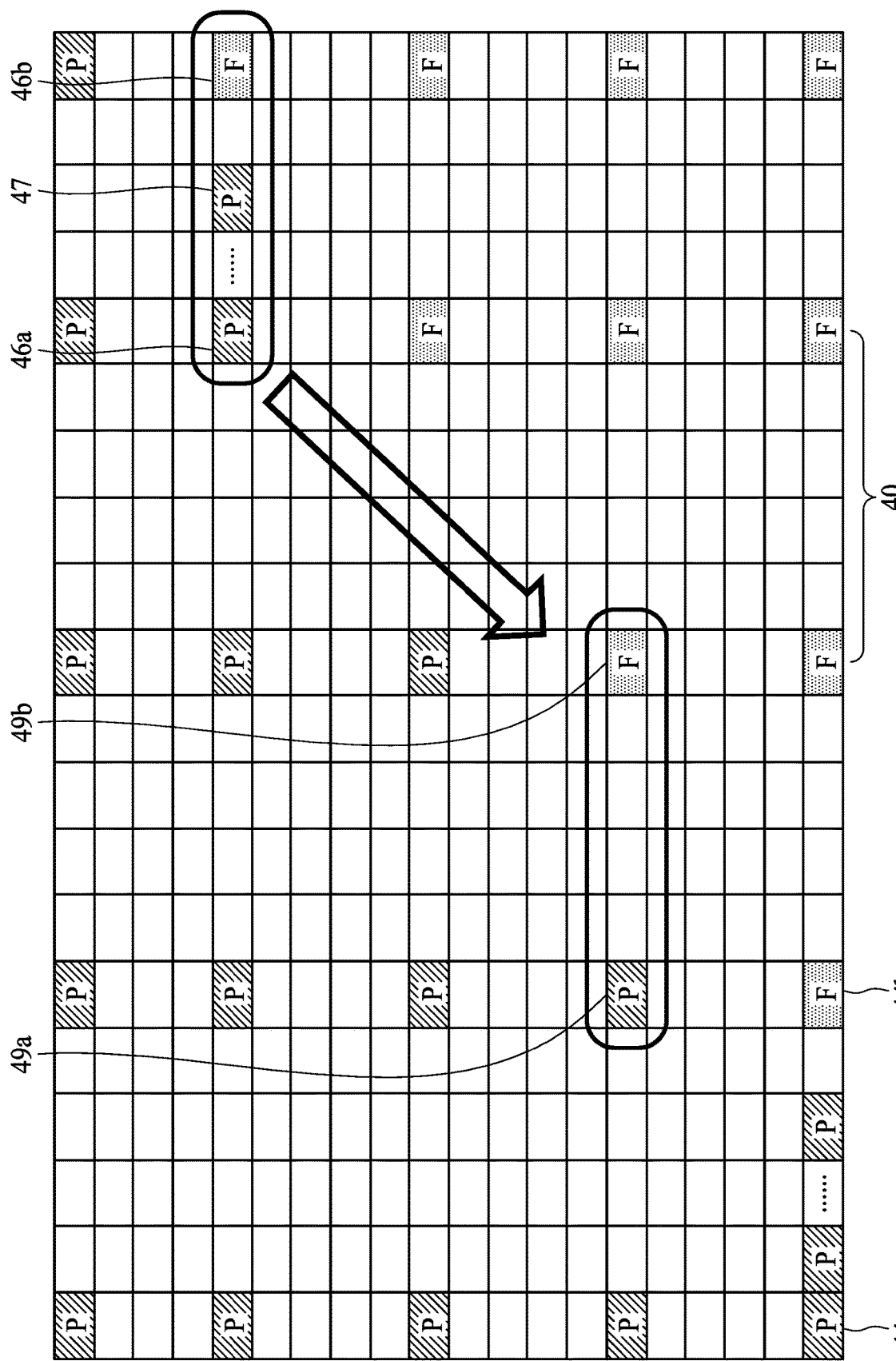
Figure 4C:
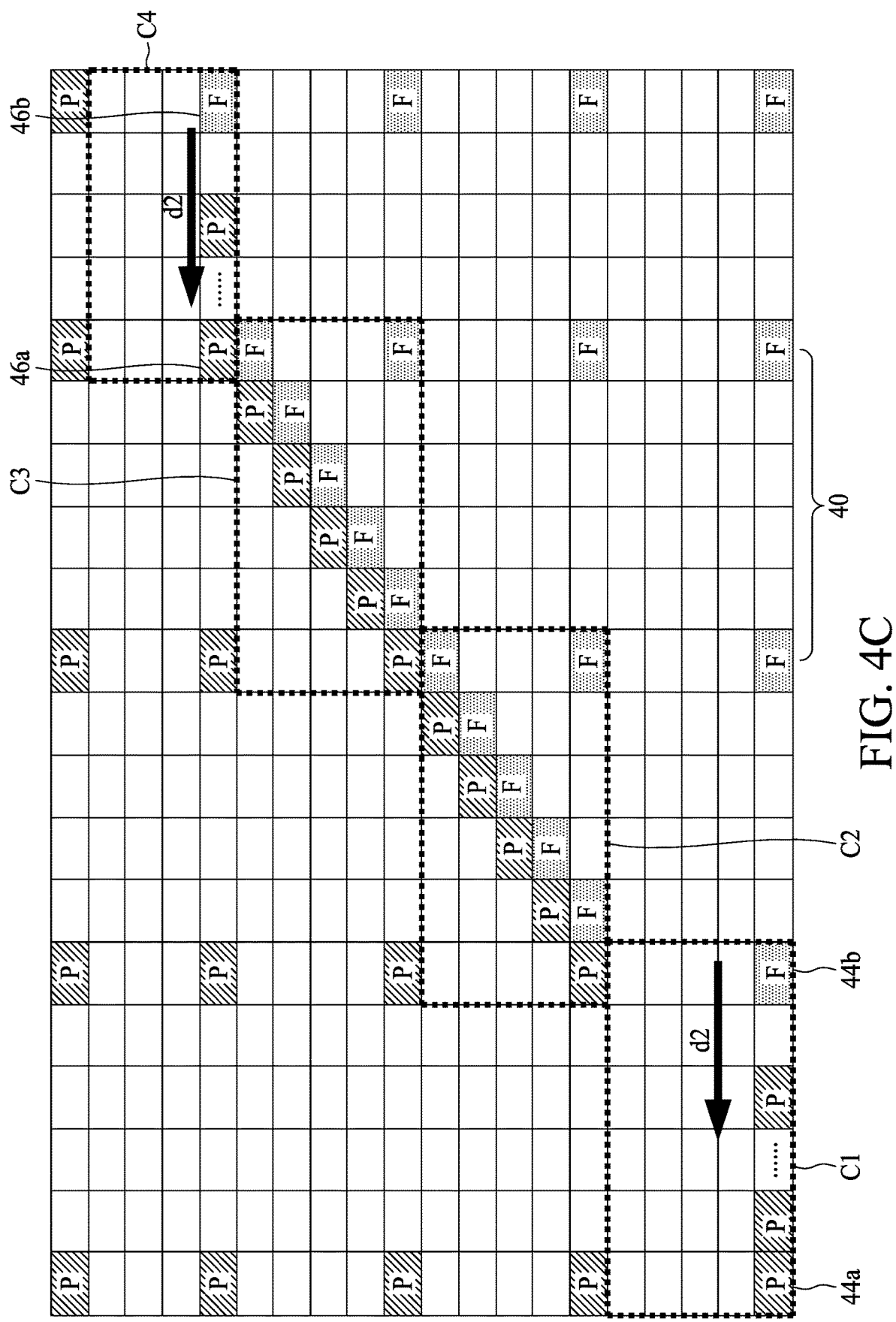

FIGS. 4A, 4B and 4C are various operations for testing electronic components in accordance with some embodiments of the present disclosure.

Referring to FIG. 4A, further operations conducted between the status 44a and the status 44b in the direction d1 is described and explained. The status 50 is obtained by providing the signal S1 having a value 50_s1 and the signal S2 having a value 50_s2 to the DUT 28. Once the value 50_s1 is equal to or exceeds a predetermined value T2 (e.g., a threshold T2) before a status change (e.g., a change from "P" to "F" or vice versa) can be found, the method includes giving up conducting further measurements between the status 44a and the status 44b, and then start measurements between another pair of statuses (e.g., another constellation).

In some embodiments, the predetermined value T2 can be a value between 44a_s1 and 44b_s1. In some embodiments, the predetermined value T2 can be a value around half of the difference value 40. In some embodiments, the predetermined value T2 can be a value around one-third (⅓) of the difference value 40. In some embodiments, the predetermined value T2 can be a value around two-third (⅔) of the difference value 40. In some embodiments, the predetermined value T2 can be a value around one-fourth (¼) of the difference value 40. In some embodiments, the predetermined value T2 can be a value around three quarters (¾) of the difference value 40. In some embodiments, the predetermined value T2 can be a value less than the difference value 40.

In some embodiments, the method includes starting further measurements between a pair of statuses that are farthest away from the pair of the status 44a and the status 44b. In some embodiments, the method includes starting further measurements between the status 46a and the status 46b. The measurements between the status 46a and the status 46b can be conducted in a manner similar to those described in accordance with FIG. 3B and FIG. 3C.

Referring to FIG. 4B, one operation of the method in accordance with some embodiments of the present disclosure is described. The status 47 is obtained by providing the signal S1 having a value 47_s1 and the signal S2 having a value 47_s2 to the DUT 28. Once the value 47_s1 is equal to or exceeds the predetermined value T2 before a status change (e.g., a change from "P" to "F" or vice versa) can be found, the method includes giving up conducting further measurements between the status 46a and the status 46b, and then start measurements between another pair of statuses.

In some embodiments, the method includes starting further measurements between the status 49a and the status 49b. The measurements between the status 49a and the status 49b can be conducted in a manner similar to those described in accordance with FIG. 3B and FIG. 3C.

FIG. 4C shows one operation of the method in accordance with some embodiments of the present disclosure is described. Referring to FIG. 4C, the measurements conducted within the constellations C2 and C3 have been completed because a virtual edge/border has been found within the constellations C2 and C3. However, a virtual edge/border has not been found within the constellations C1 and C4 because the measurements conducted along the direction d1 have been halted, as discussed in accordance with FIGS. 4A and 4B. The method in accordance with some embodiments of the present disclosure may further include conducting measurements on the constellations C1 and C4 again, along a direction d2 that is different from the direction d1.

In some embodiments, the measurements conducted on the constellations C1 can commence from the status 44b toward the status 44a. The measurements within the constellations C1 can be conducted in a manner similar to those described in accordance with FIG. 3B and FIG. 3C. In some embodiments, the measurements conducted on the constellations C4 can commence from the status 46b toward the status 46a. The measurements within the constellations C4 can be conducted in a manner similar to those described in accordance with FIG. 3B and FIG. 3C.

The operations described in accordance with FIGS. 3A, 3B, 3C, 3D, 4A, 4B and 4C can be applied to several manufacturing stages of semiconductor/integrated devices.

In some embodiments, the operations described in accordance with FIGS. 3A, 3B, 3C, 3D, 4A, 4B and 4C can be applied to the mass production of a newly designed product. By obtaining the two-dimensional representation (e.g., the Shmoo plot) of the operation regions of the newly designed product, engineers involved in the mass production can easily understand the operation limitations of the newly designed product. For example, engineers involved in the quality control process of the newly designed product can easily understand the criteria of determining the yield rate of the product.

In some embodiments, the operations described in accordance with FIGS. 3A, 3B, 3C, 3D, 4A, 4B and 4C can be applied to classifying products. For example, a product having a wider operation region can be classified as a high-end product and has a higher price. A wider operation region of a product shows that the product may still work properly in a severe environment (for example, in a high temperature or in a high pressure).

In the operations described in accordance with FIGS. 3A, 3B, 3C, 3D, 4A, 4B and 4C, if a fail result (e.g., "F") is obtained (which means that the feedback signal Z provided by the DUT 28 in response to the signal S1 and the signal S2 fails to comply with or fails to fulfill a specific criterion for the DUT 28), several operations may be conducted.

In some embodiments, if a fail result is obtained, a failure analysis can be conducted with respect to the overall test procedure. In some embodiments, if a fail result is obtained, a failure analysis can be conducted with respect to the equipment used during the test procedure. For example, devices and modules of the apparatus as described in accordance with FIG. 1 can be checked and examined. In some embodiments, if a fail result is obtained, the environment (for example, the temperature and/or the humidity) in which the test was conducted can be checked and examined.

If a fail result is obtained in the condition that the overall test procedure is correct (for example, nothing abnormal can be found in the test equipment and the test environment), the final Shmoo plot can be provided to the next-stage of the mass production process. In some embodiments, the final Shmoo plot can be provided to a downstream manufacturer. The downstream manufacturer can fine tune its manufacturing process base on the Shmoo plot.

Figure 5A:
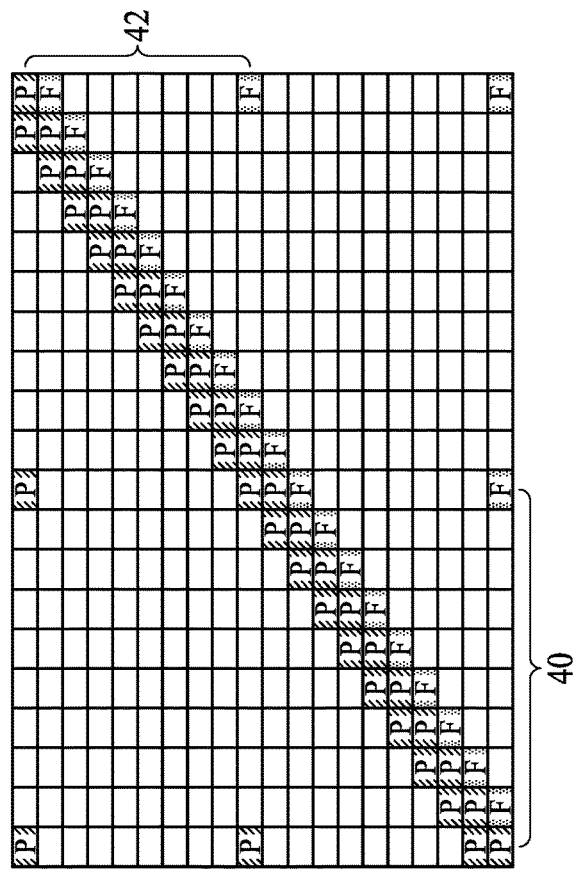
FIG. 5A and FIG. 5B are schematic diagrams showing a visual representation of the measurement results after the testing is completed, in accordance with some embodiments of the present disclosure.
Figure 5B:
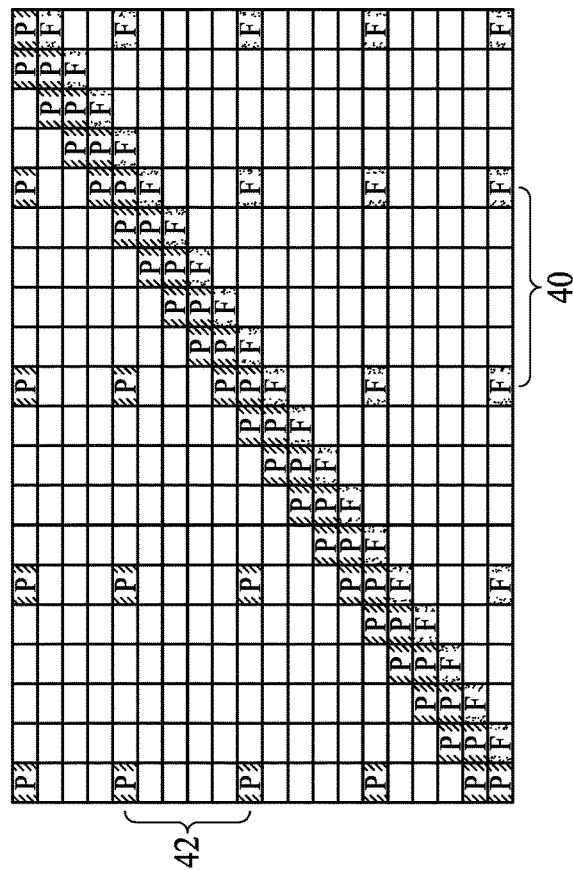

FIGS. 5A and 5B are schematic diagrams showing a visual representation of the measurement results after the testing is completed, in accordance with some embodiments of the present disclosure.

The method in accordance with some embodiments of the present disclosure includes adjusting the difference value 40 and the difference value 42 in order to modifying the number of "pilot points" or "pilot measurements" of the test. Referring to FIGS. 5A and 5B, the difference value 40 in FIG. 5B is greater than that in FIG. 5A, and the difference value 42 in FIG. 5B is greater than that in FIG. 5A.

FIG. 5A is a visual representation of the measurement results under the condition that the number of "pilot points" is selected to be 25. That is, five different values of the signal S1 and five different values of the signal S2 are provided to the DUT 28. In the embodiment shown in FIG. 5A, in addition to the 25 pilot points, another 53 measurements are performed before a precise operation region of the DUT 28 can be determined. Therefore, total 78 measurements are performed before the test of the DUT 28 is completed.

Compared to the embodiment shown in FIG. 2B, the overall number of measurements performed for the embodiment shown in FIG. 5A are significantly reduced from 400 to 78. The time requested for completing a Shmoo plot is thus reduced nearly 80% and the efficiency of the embodiment shown in FIG. 5A increases significantly.

FIG. 5B is a visual representation of the measurement results under the condition that the number of "pilot points" is selected to be 9. That is, three different values of the signal S1 and three different values of the signal S2 are provided to the DUT 28. In the embodiment shown in FIG. 5B, in addition to the 9 pilot points, another 55 measurements are performed before a precise operation region of the DUT 28 can be determined. Therefore, total 64 measurements are performed before the test of the DUT 28 is completed.

Compared to the embodiment shown in FIG. 2B, the overall number of measurements performed for the embodiment shown in FIG. 5B are significantly reduced from 400 to 64. The time requested for completing a Shmoo plot is thus reduced 84% and the efficiency of the embodiment shown in FIG. 5B increases significantly.

Figure 6A:
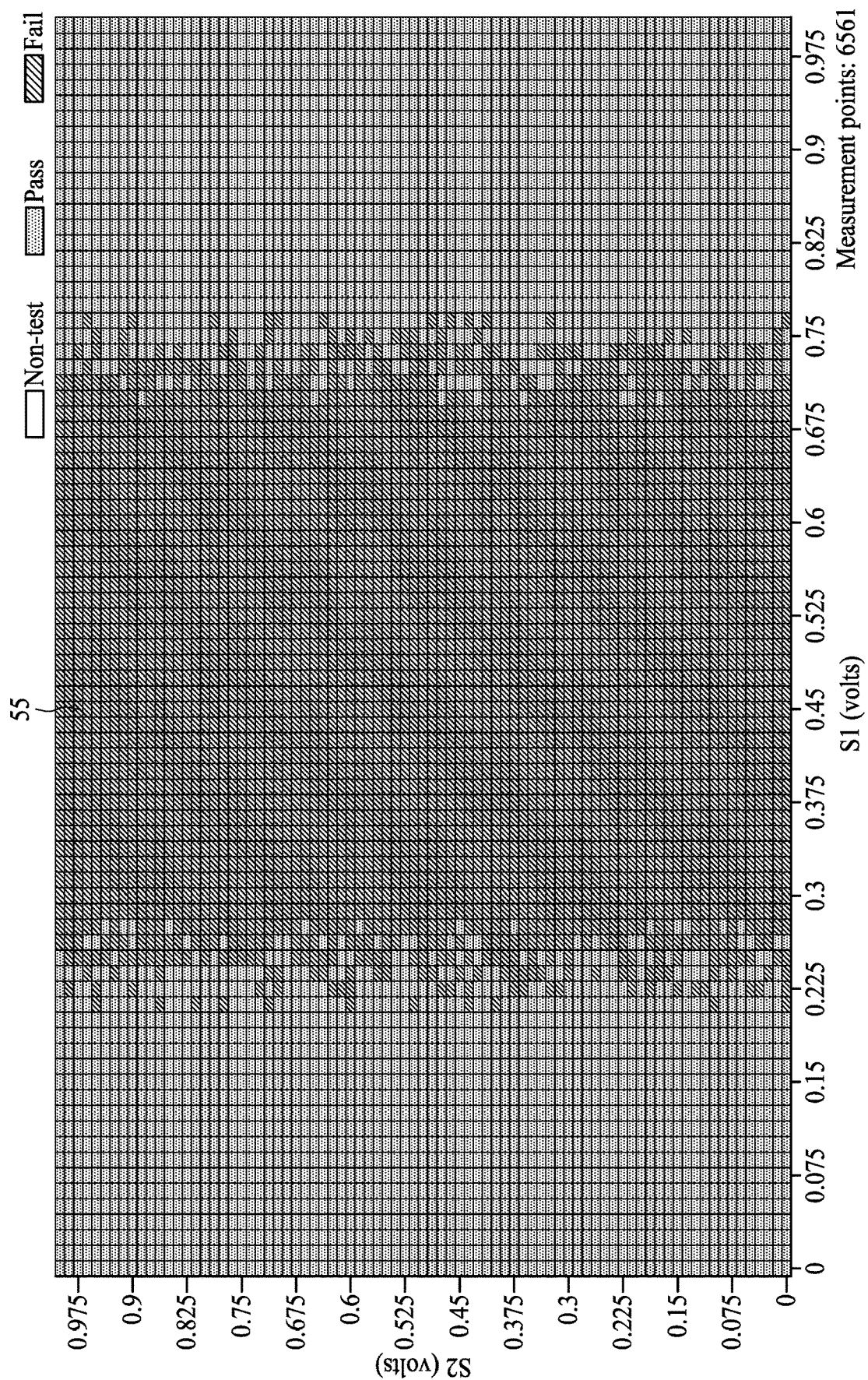
FIG. 6A is a visual representation of the measurement results of an electronic component, in accordance with a comparative embodiment of the present disclosure.

FIG. 6A is a visual representation of the measurement results of an electronic component, in accordance with a comparative embodiment of the present disclosure. Referring to FIG. 6A, both the signals S1 and S2 provided to the DUT 28 are voltage signals. In this comparative embodiment, the DUT 28 cannot function appropriately if the signal S1 provided is in a range of about 0.225 volts to 0.75 volts. In this comparative embodiment, the DUT 28 cannot function appropriately if the combinations of the signals S1 and S2 fall within the region 55. In this comparative embodiment, total 6561 measurements were conducted before the operation region of the DUT 28 can be determined.

Figure 6B:
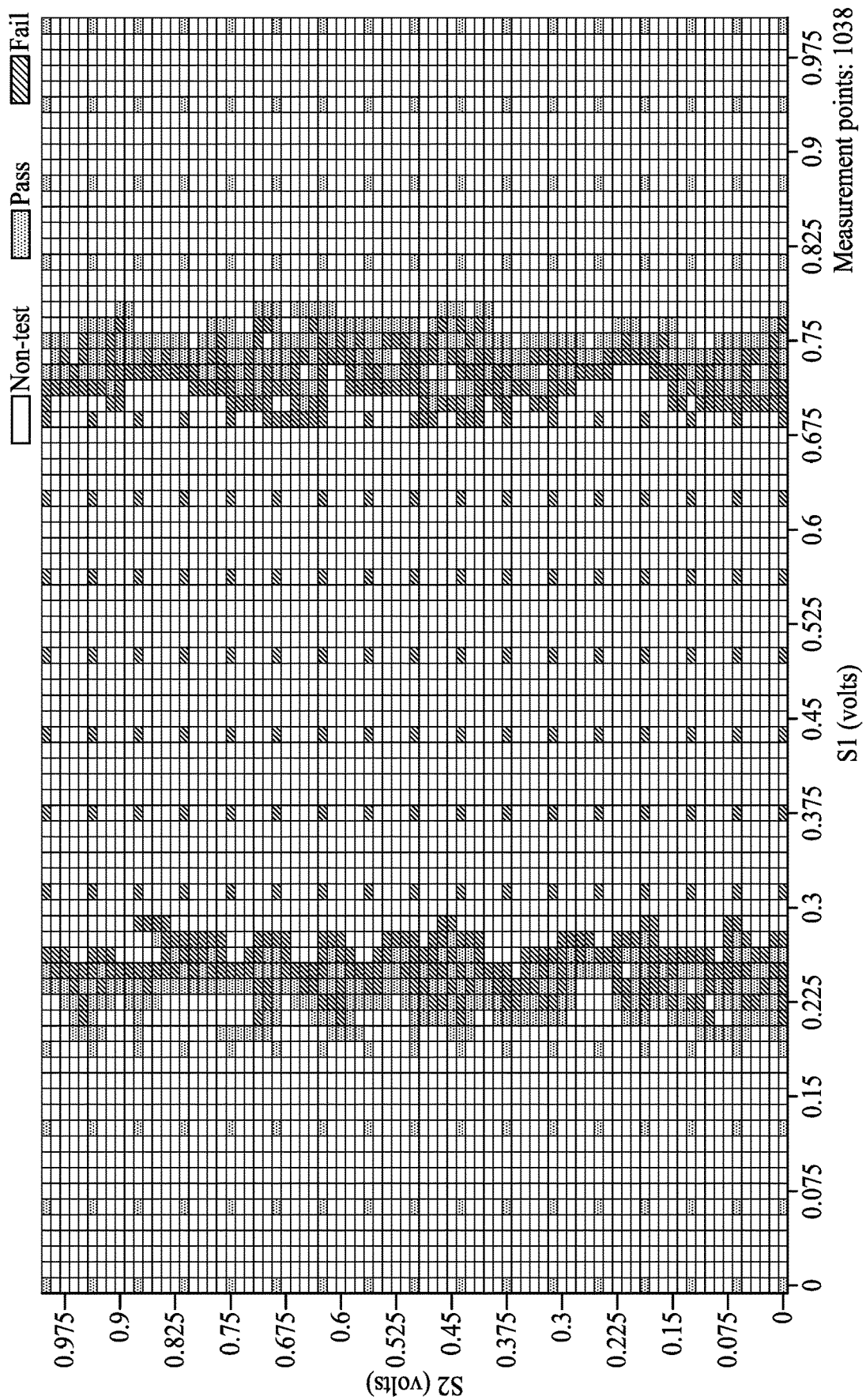
FIG. 6B is a visual representation of the measurement results of an electronic component, in accordance with some embodiments of the present disclosure.

FIG. 6B is a visual representation of the measurement results of an electronic component, in accordance with some embodiments of the present disclosure. The measurement results shown in FIG. 6B can be obtained based on the operations discussed above in accordance with FIGS. 3A, 3B, 3C, 3D, 4A, 4B and 4C. In this embodiment, just 1038 measurements were conducted before the operation region of the DUT 28 can be determined. It is noted that the efficiency of the embodiment shown in FIG. 6B is relatively higher than that of the comparative embodiment shown in FIG. 6A.

Figure 7A:
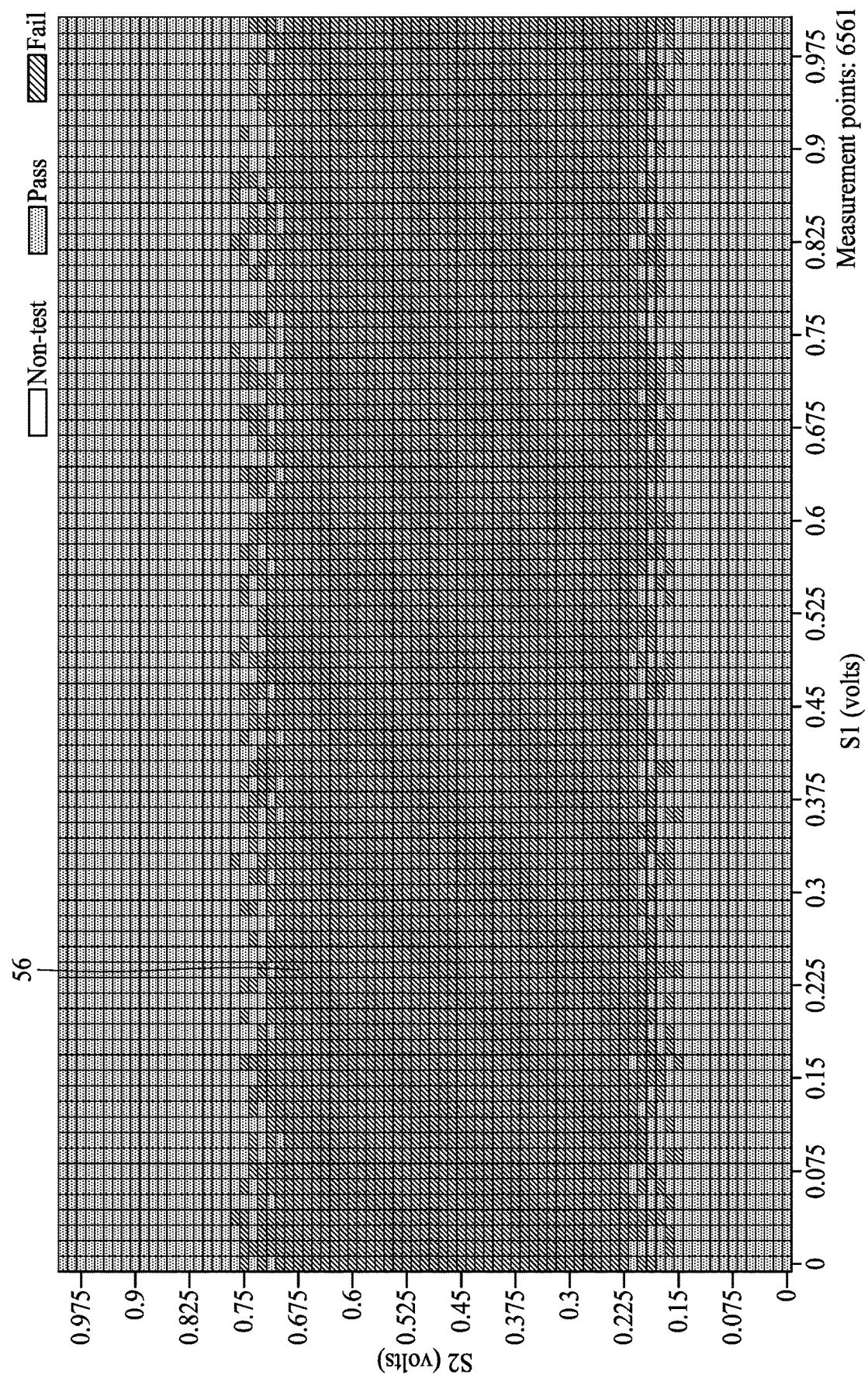
FIG. 7A is a visual representation of the measurement results of an electronic component, in accordance with a comparative embodiment of the present disclosure.

FIG. 7A is a visual representation of the measurement results of an electronic component, in accordance with a comparative embodiment of the present disclosure. Referring to FIG. 7A, both the signals S1 and S2 provided to the DUT 28 are voltage signals. In this comparative embodiment, the DUT 28 cannot function appropriately if the signal S2 provided is in a range of about 0.15 volts to 0.75 volts. In this comparative embodiment, the DUT 28 cannot function appropriately if the combinations of the signals S1 and S2 fall within the region 56. In this comparative embodiment, total 6561 measurements were conducted before the operation region of the DUT 28 can be determined.

Figure 7B:
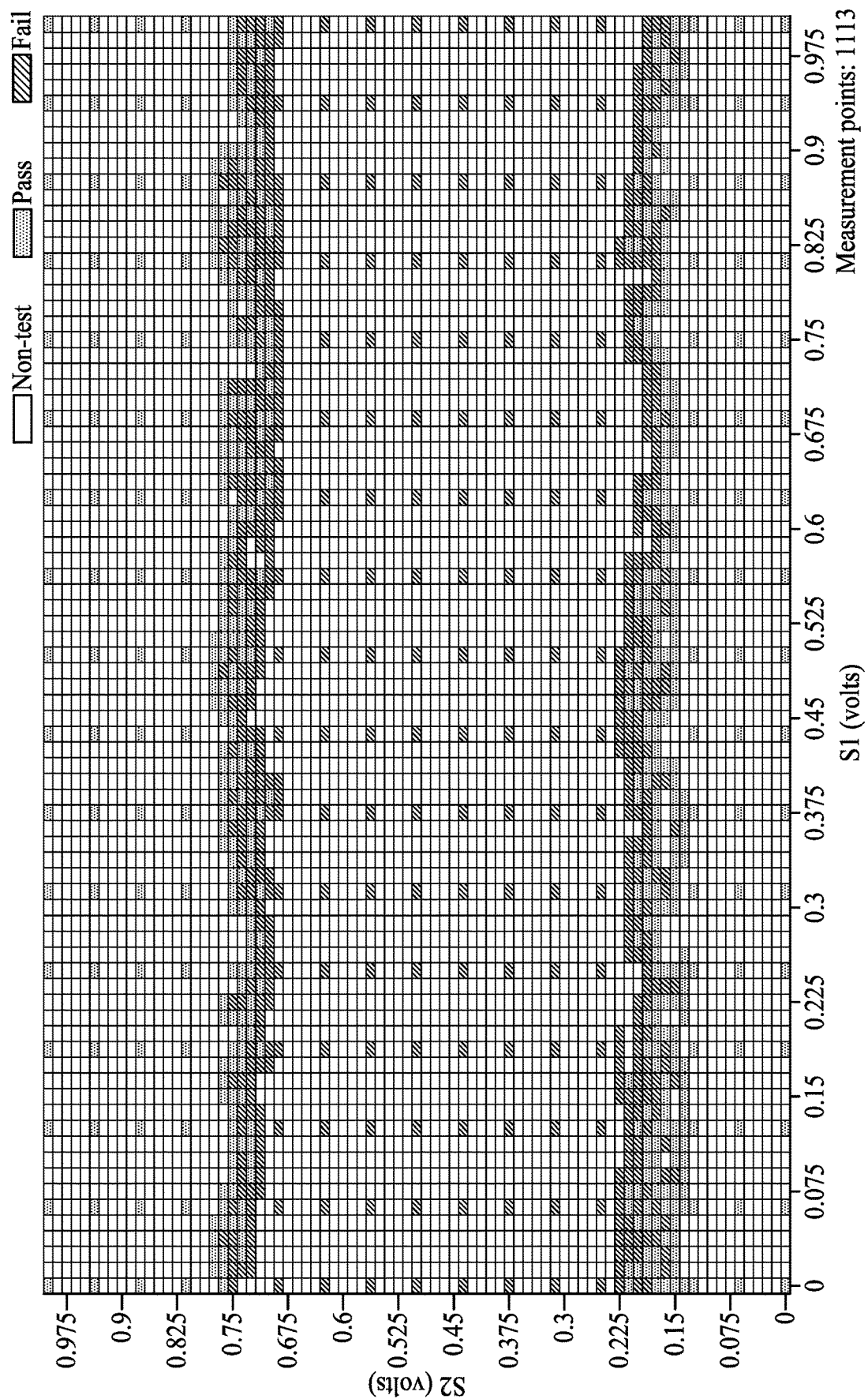
FIG. 7B is a visual representation of the measurement results of an electronic component, in accordance with some embodiments of the present disclosure.

FIG. 7B is a visual representation of the measurement results of an electronic component, in accordance with some embodiments of the present disclosure. The measurement results shown in FIG. 7B can be obtained based on the operations discussed above in accordance with FIGS. 3A, 3B, 3C, 3D, 4A, 4B and 4C. In this embodiment, just 1113 measurements were conducted before the operation region of the DUT 28 can be determined. It is noted that the efficiency of the embodiment shown in FIG. 7B is relatively higher than that of the comparative embodiment shown in FIG. 7A.

Figure 8A:
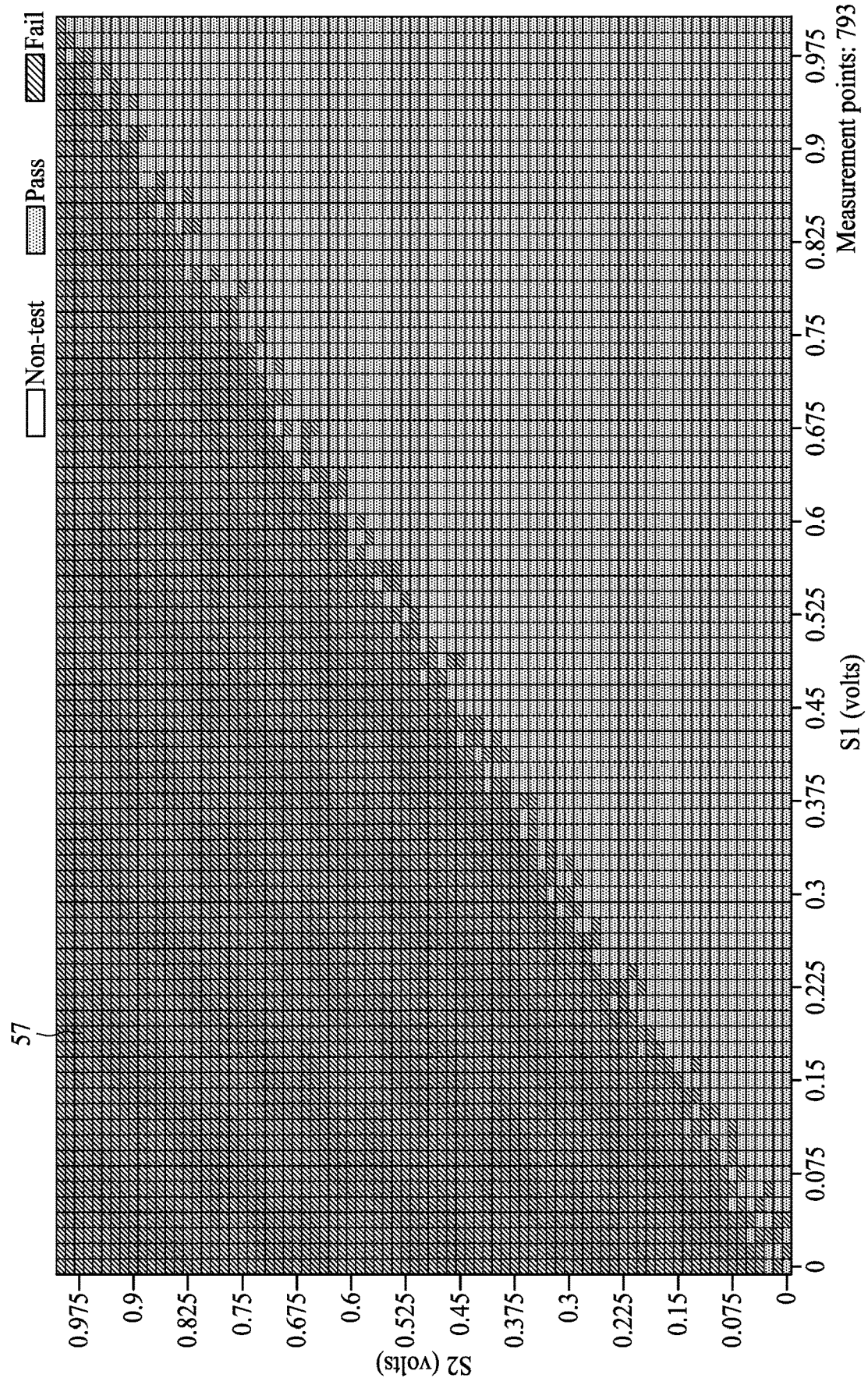
FIG. 8A is a visual representation of the measurement results of an electronic component, in accordance with a comparative embodiment of the present disclosure.

FIG. 8A is a visual representation of the measurement results of an electronic component, in accordance with a comparative embodiment of the present disclosure. Referring to FIG. 8A, both the signals S1 and S2 provided to the DUT 28 are voltage signals. In this comparative embodiment, the DUT 28 cannot function appropriately if the combinations of the signals S1 and S2 fall within the region 57. In this comparative embodiment, total 6561 measurements were conducted before the operation region of the DUT 28 can be determined.

Figure 8B:
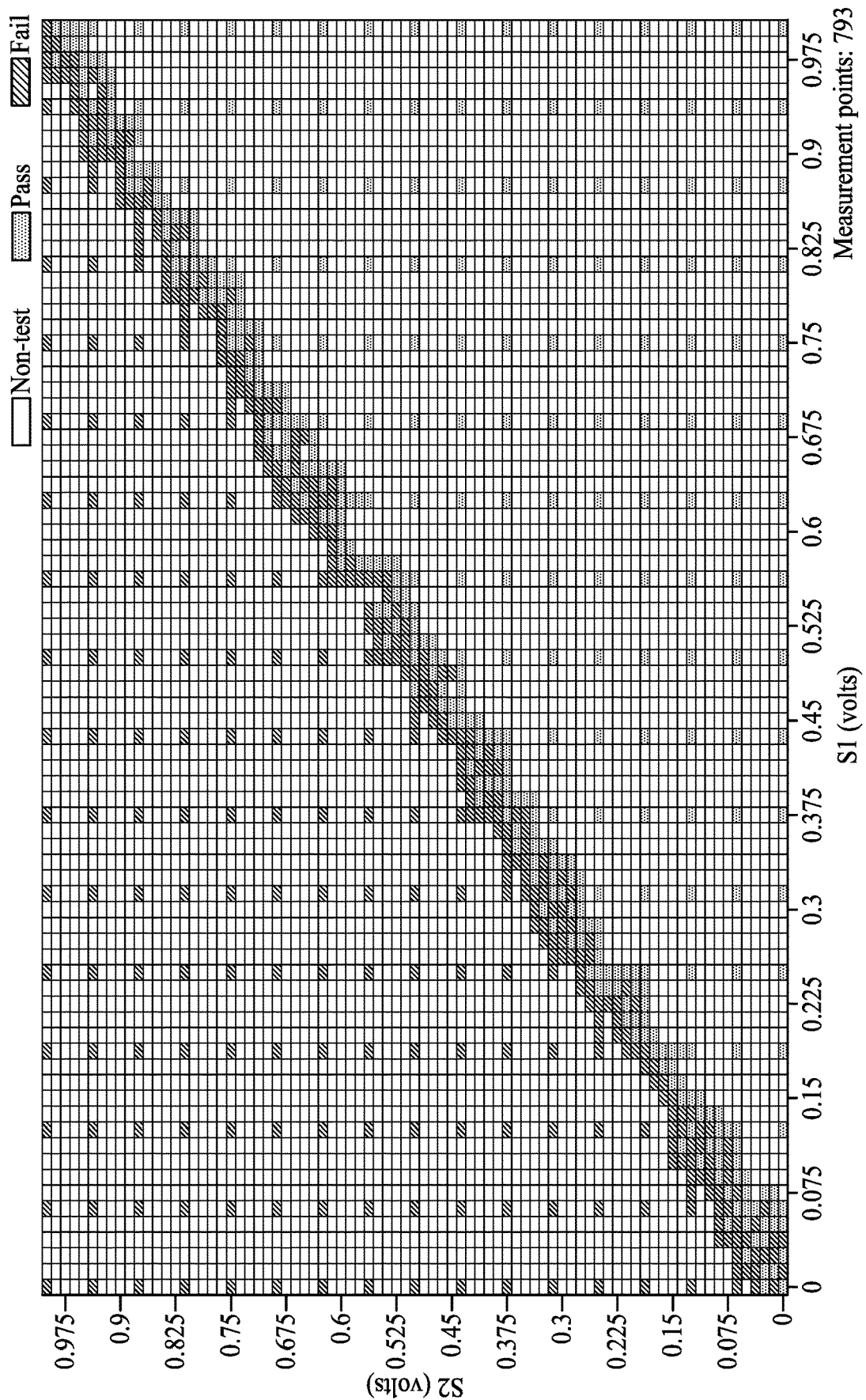
FIG. 8B is a visual representation of the measurement results of an electronic component, in accordance with some embodiments of the present disclosure.

FIG. 8B is a visual representation of the measurement results of an electronic component, in accordance with some embodiments of the present disclosure. The measurement results shown in FIG. 8B can be obtained based on the operations discussed above in accordance with FIGS. 3A, 3B, 3C, 3D, 4A, 4B and 4C. In this embodiment, just 793 measurements were conducted before the operation region of the DUT 28 can be determined. It is noted that the efficiency of the embodiment shown in FIG. 8B is relatively higher than that of the comparative embodiment shown in FIG. 8A.

Figure 9C:
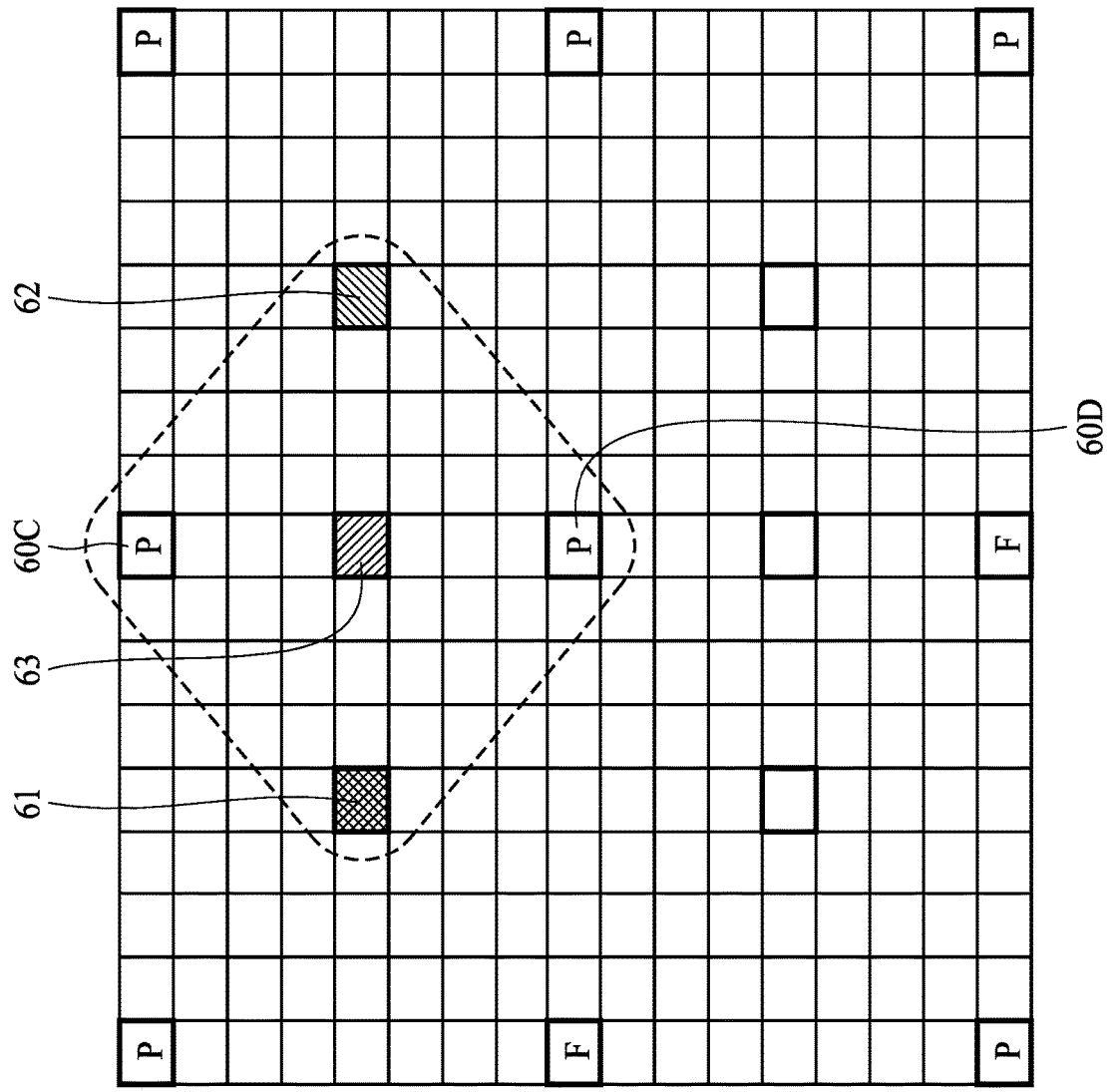

FIGS. 9A, 9B and 9C are various operations for testing electronic components in accordance with some comparative embodiments of the present disclosure.

The method includes providing the signal S1 and the signal S2 having various values in order to obtain the "pilot measurements," similar to those described in accordance with FIG. 3A. Once the "pilot measurements" have been completed, further measurements can be conducted for a group of four pilot points. Referring to FIG. 9A, if the statuses of the four pilot points are not identical (e.g., the status 60B is different from the statuses 60A, 60C and 60D), a further measurement is conducted in order to determine the status 61.

The status 61 can be obtained by providing the signal S1 having a value $61\_s1$ and the signal S2 having a value $61\_s2$. The status 60A can be obtained by providing the signal S1 having a value $60A\_s1$ and the signal S2 having a value $60A\_s2$. The status 60B can be obtained by providing the signal S1 having a value $60B\_s1$ and the signal S2 having a value $60B\_s2$. The status 60C can be obtained by providing the signal S1 having a value $60C\_s1$ and the signal S2 having a value $60C\_s2$. The status 60D can be obtained by providing the signal S1 having a value $60D\_s1$ and the signal S2 having a value $60D\_s2$.

In some embodiments, the status 61 can be the geometrical center of the visual representation of the statuses 60A, 60B, 60C and 60D. In some embodiments, the value $61\_s1$ is between the value $60C\_s1$ and $60B\_s1$. In some embodiments, the value $61\_s2$ is between the value $60A\_s2$ and $60B\_s2$.

Referring to FIG. 9B, on the other hand, if the statuses of the four pilot points are identical (e.g., all of the statuses 60A, 60B, 60C and 60D are "P"), a further measurement is not necessary to determine the status 62. The status 62 can be assigned to be identical to 60A, 60B, 60C and 60D. A status that is obtained by assignment can be referred to as an "interpolation point" in the subsequent paragraph.

Referring to FIG. 9C, a group of the statuses 60C, 60D, 61 and 62 can be further used to obtain the status 63. The status 63 can be determined in a manner similar to or identical to those as described in accordance with FIGS. 9A and 9B. In some embodiments, if the statuses 60C, 60D, 61 and 62 are identical to each other, the status 63 is assigned to be identical to 60C, 60D, 61 and 62.

In some embodiments, if the statuses 60C, 60D, 61 and 62 are not identical to each other, the method includes providing the signal S1 having a value $63\_s1$ and the signal S2 having a value $63\_s2$ to the DUT 28, and determining the status 63 based on the feedback signal Z outputted by the DUT 28.

The operations as described in accordance with FIGS. 9A, 9B and 9C can be repeated or iterated. Following the operations as illustrated in accordance with FIGS. 9A, 9B and 9C, a precise operation region of the DUT 28 can be found.

However, the operations as described in accordance with FIGS. 9A, 9B and 9C are more complex in computation than those described in accordance with FIGS. 3A, 3B, 3C, 3D, 4A, 4B and 4C. The operations as described in accordance with FIGS. 9A, 9B and 9C involve calculations based on trigonometric functions because the geometrical center (for example, the status 61) of four statuses disposed in a shape of rectangle (for example, the statuses 60A, 60B, 60C and 60D) is to be found. The computation complexity for the operations as described in accordance with FIGS. 9A, 9B and 9C is therefore $O(n^2)$, which means they involve an exponential run time. On the contrary, the computation complexity for the operations as described in accordance with FIGS. 3A, 3B, 3C, 3D, 4A, 4B and 4C is $O(n)$ since the calculations involved is linear and thus they take a linear run time.

Figure 10B:
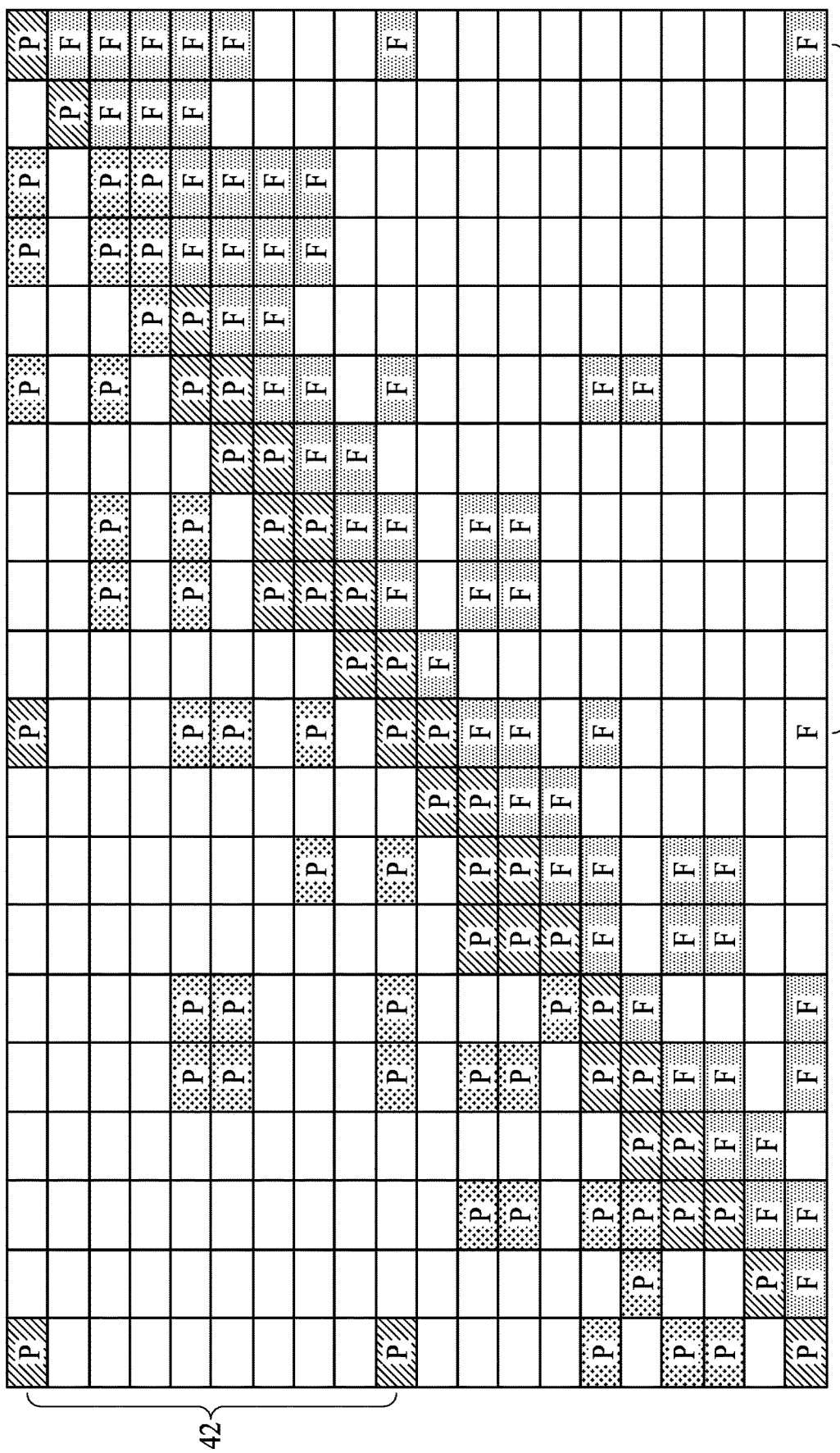

FIGS. 10A and 10B are schematic diagrams showing a visual representation of the measurement results after the testing is completed, in accordance with some comparative embodiments of the present disclosure.

The visual representation of the measurement results as shown in FIGS. 10A and 10B can be obtained using the method described in accordance with FIGS. 9A, 9B and 9C. The method in accordance with the comparative embodiments of the present disclosure includes adjusting the difference value 40 and the difference value 42 in order to modifying the number of "pilot points" or "pilot measurements" of the test. Referring to FIGS. 10A and 10B, the difference value 40 in FIG. 10B is greater than that in FIG. 10A, and the difference value 42 in FIG. 10B is greater than that in FIG. 10A.

FIG. 10A is a visual representation of the measurement results under the condition that the number of "pilot points" is selected to be 25. That is, five different values of the signal S1 and five different values of the signal S2 are provided to the DUT 28. In the embodiment shown in FIG. 10A, in addition to the 25 pilot points, another 74 measurements are performed before a precise operation region of the DUT 28 can be determined. Therefore, total 99 measurements are performed before the test of the DUT 28 is completed. In addition, 24 "interpolation points" are used during the test.

Compared to the embodiment shown in FIG. 2B, the overall number of measurements for the embodiment shown in FIG. 10A are reduced from 400 to 99. The time requested for measuring is thus reduced about 75%. However, the embodiment shown in FIG. 10A specifies additional computation of the "interpolation points" and thus will increase the overall time for completing a Shmoo plot. In addition, as previously discussed in accordance with FIGS. 9A, 9B and 9C, the computation complexity for the embodiment shown in FIG. 10A is much higher than that for the embodiment shown in FIG. 5A.

FIG. 10B is a visual representation of the measurement results under the condition that the number of "pilot points" is selected to be 9. That is, three different values of the signal S1 and three different values of the signal S2 are provided to the DUT 28. In the embodiment shown in FIG. 10B, in addition to the 9 pilot points, another 84 measurements are performed before a precise operation region of the DUT 28 can be determined. Therefore, total 93 measurements are performed before the test of the DUT 28 is completed. In addition, 35 "interpolation points" are used during the test.

Compared to the embodiment shown in FIG. 2B, the overall number of measurements performed for the embodiment shown in FIG. 10B are reduced from 400 to 93. The time requested for measuring is thus reduced about 76%. However, the embodiment shown in FIG. 10B specifies additional computation of the "interpolation points" and thus will increase the overall time for completing a Shmoo plot. In addition, as previously discussed in accordance with FIGS. 9A, 9B and 9C, the computation complexity for the embodiment shown in FIG. 10B is much higher than that for the embodiment shown in FIG. 5B.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Ranges can be expressed herein as from one endpoint to another endpoint or between two endpoints. All ranges disclosed herein are inclusive of the endpoints, unless specified otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

For example, two surfaces can be deemed to be coplanar or substantially coplanar if a displacement between the two surfaces is equal to or less than 5 μm, equal to or less than 2 μm, equal to or less than 1 μm, or equal to or less than 0.5 μm. A surface can be deemed to be planar or substantially planar if a displacement of the surface relative to a flat plane between any two points on the surface is equal to or less than 5 μm, equal to or less than 2 μm, equal to or less than 1 μm, or equal to or less than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Spatial descriptions, such as "above," "below," "up," "left," "right," "down," "top," "bottom," "vertical," "horizontal," "side," "higher," "lower," "upper," "over," "under," "downward," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. An apparatus, comprising:
a control unit; and
a memory including computer program code; and
wherein the memory and the computer program code are configured to, with the control unit, cause the apparatus to:
apply a first signal having a first value and a second signal having a second value to an electronic component and a receiving feedback signal for determining a first parameter;
apply the first signal having a third value and the second signal to the electronic component and receiving a feedback signal for determining a second parameter;
apply the first signal having a fourth value and the second signal to the electronic component if the first parameter is different from the second parameter and receiving a feedback signal for determining a third parameter, wherein a first difference exists between the third value and the first value, wherein a second difference exists between the fourth value and the first value; and
provide the first parameter, the second parameter, and the third parameter to a display device for displaying in a two-dimensional plot,
wherein at least 64 parameters are determined based on the first signal and the second signal before a test of the electronic component is completed.

* * * * *